US012264391B2

(12) United States Patent
Cho

(10) Patent No.: US 12,264,391 B2
(45) Date of Patent: Apr. 1, 2025

(54) APPARATUS FOR MANUFACTURING DISPLAY DEVICE, METHOD OF MANUFACTURING MASK ASSEMBLY, AND METHOD OF MANUFACTURING DISPLAY DEVICE

(71) Applicant: SAMSUNG DISPLAY CO., LTD., Yongin-si (KR)

(72) Inventor: Wonje Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/501,708

(22) Filed: Nov. 3, 2023

(65) Prior Publication Data

US 2024/0060169 A1 Feb. 22, 2024

Related U.S. Application Data

(62) Division of application No. 17/230,867, filed on Apr. 14, 2021, now Pat. No. 11,807,933.

(30) Foreign Application Priority Data

Aug. 10, 2020 (KR) .................. 10-2020-0099937

(51) Int. Cl.
*H10K 71/16* (2023.01)
*C23C 14/04* (2006.01)
(Continued)

(52) U.S. Cl.
CPC ........ *C23C 14/042* (2013.01); *C23C 14/0682* (2013.01); *C23C 14/08* (2013.01); *H10K 71/166* (2023.02); *H10K 71/231* (2023.02)

(58) Field of Classification Search
CPC ... C23C 14/042; H10K 71/166; H10K 71/231
See application file for complete search history.

(56) References Cited

U.S. PATENT DOCUMENTS

| 5,808,714 A * | 9/1998 | Rowlands ......... G02F 1/133512 349/110 |
| 6,861,358 B2 * | 3/2005 | Hasegawa ............. C23C 14/042 438/689 |

(Continued)

FOREIGN PATENT DOCUMENTS

| CN | 1901138 A | 1/2007 |
| JP | 2011-117028 A | 6/2011 |

(Continued)

OTHER PUBLICATIONS

Chinese Notification of First Office Action, for Patent Application No. 202110879485.6, dated Dec. 30, 2024, 9 pages.

*Primary Examiner* — Jaehwan Oh
(74) *Attorney, Agent, or Firm* — Womble Bond Dickinson (US) LLP

(57) ABSTRACT

An apparatus for manufacturing a display device includes a mask assembly, the mask assembly including a silicon substrate having a first surface, a second surface opposite the first surface, and a first opening portion penetrating the first surface and the second surface, and a support substrate on the second surface, the support substrate having a second opening portion connected to the first opening portion. The first opening portion at the first surface is less in width than the first opening portion at the second surface.

10 Claims, 16 Drawing Sheets

(51) Int. Cl.
   *C23C 14/06*   (2006.01)
   *C23C 14/08*   (2006.01)
   *H10K 71/20*   (2023.01)

(56) References Cited

U.S. PATENT DOCUMENTS

| | | |
|---|---|---|
| 7,268,406 B2 | 9/2007 | Yotsuya et al. |
| 10,580,985 B2 | 3/2020 | Nishida et al. |
| 10,726,780 B2 | 7/2020 | Shim et al. |
| 11,038,009 B2 * | 6/2021 | Ju .................. C23C 14/12 |
| 11,211,558 B2 * | 12/2021 | Nakamura ............. C23F 1/02 |
| 2002/0028394 A1 | 3/2002 | Watanabe et al. |
| 2002/0059903 A1 * | 5/2002 | Hasegawa ........... C23C 14/042 |
| | | 118/504 |
| 2005/0211981 A1 | 9/2005 | Yotsuya et al. |
| 2016/0141498 A1 | 5/2016 | Ghosh et al. |
| 2020/0044010 A1 * | 2/2020 | Ju .................. C23C 14/12 |
| 2020/0058906 A1 | 2/2020 | Kim et al. |
| 2020/0295265 A1 * | 9/2020 | Moraes ............ C23C 14/5873 |

FOREIGN PATENT DOCUMENTS

| | | |
|---|---|---|
| JP | 6462157 B2 | 1/2019 |
| KR | 2002-0018949 A | 3/2002 |
| KR | 10-1362165 B1 | 2/2014 |
| KR | 10-2019-0029814 A | 3/2019 |
| KR | 10-2020-0021573 A | 3/2020 |

* cited by examiner

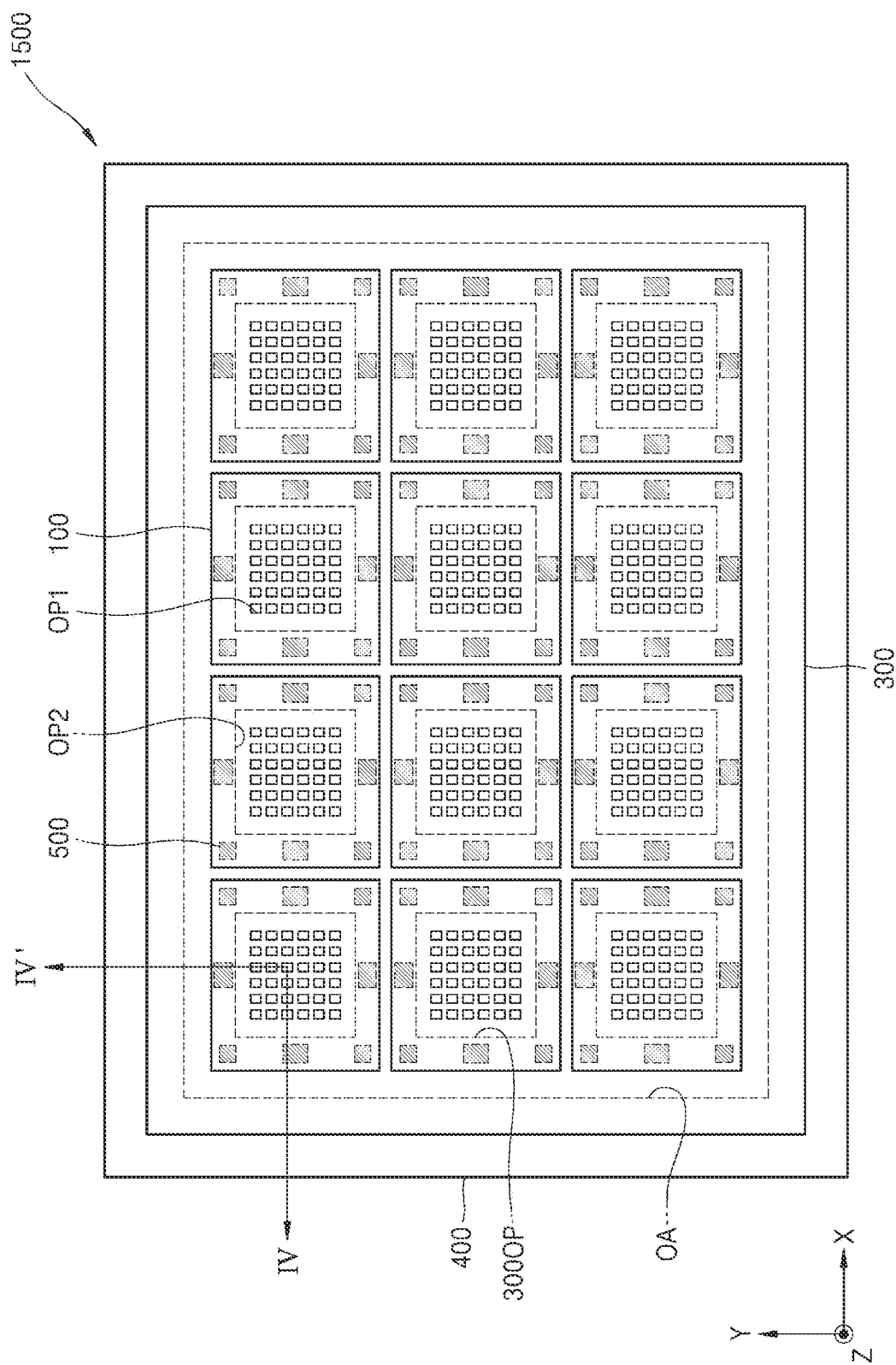

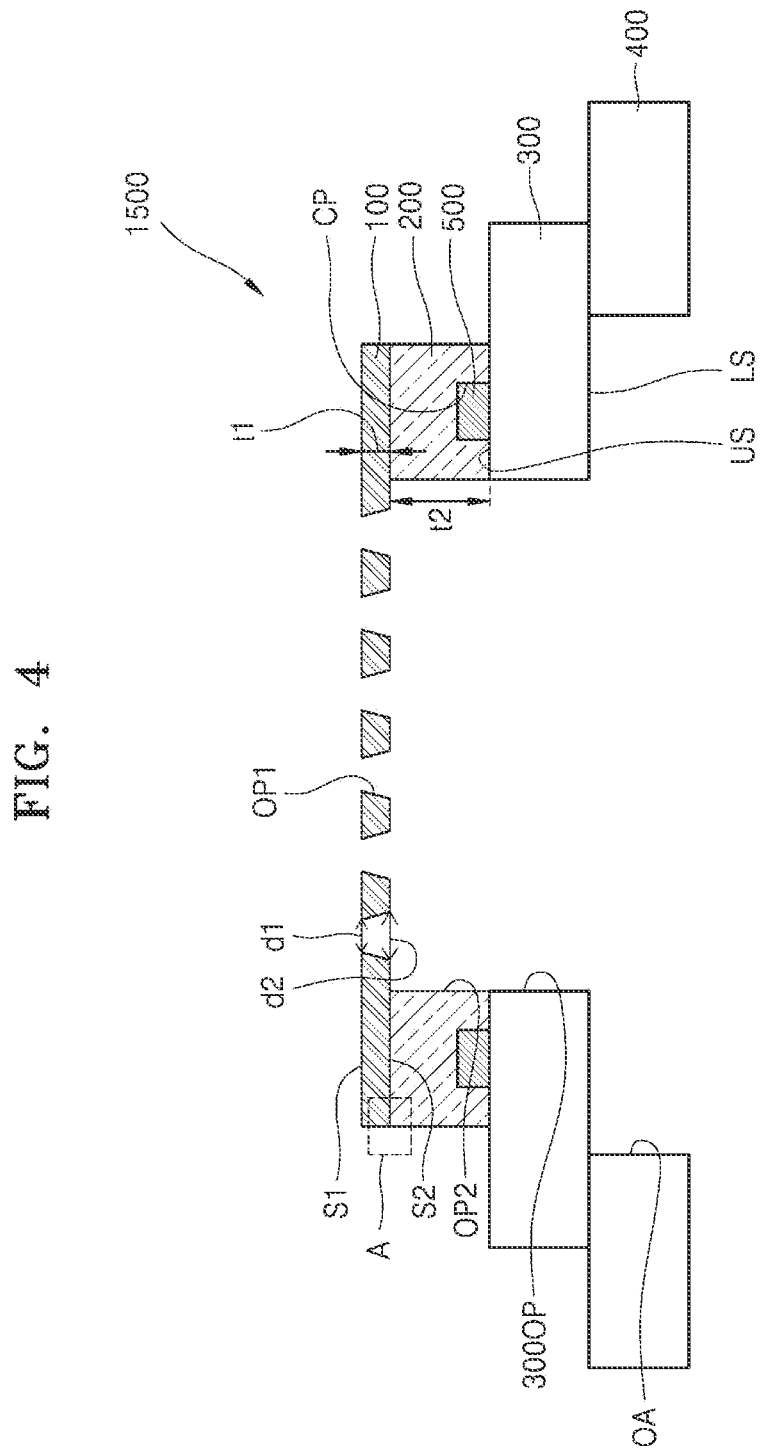

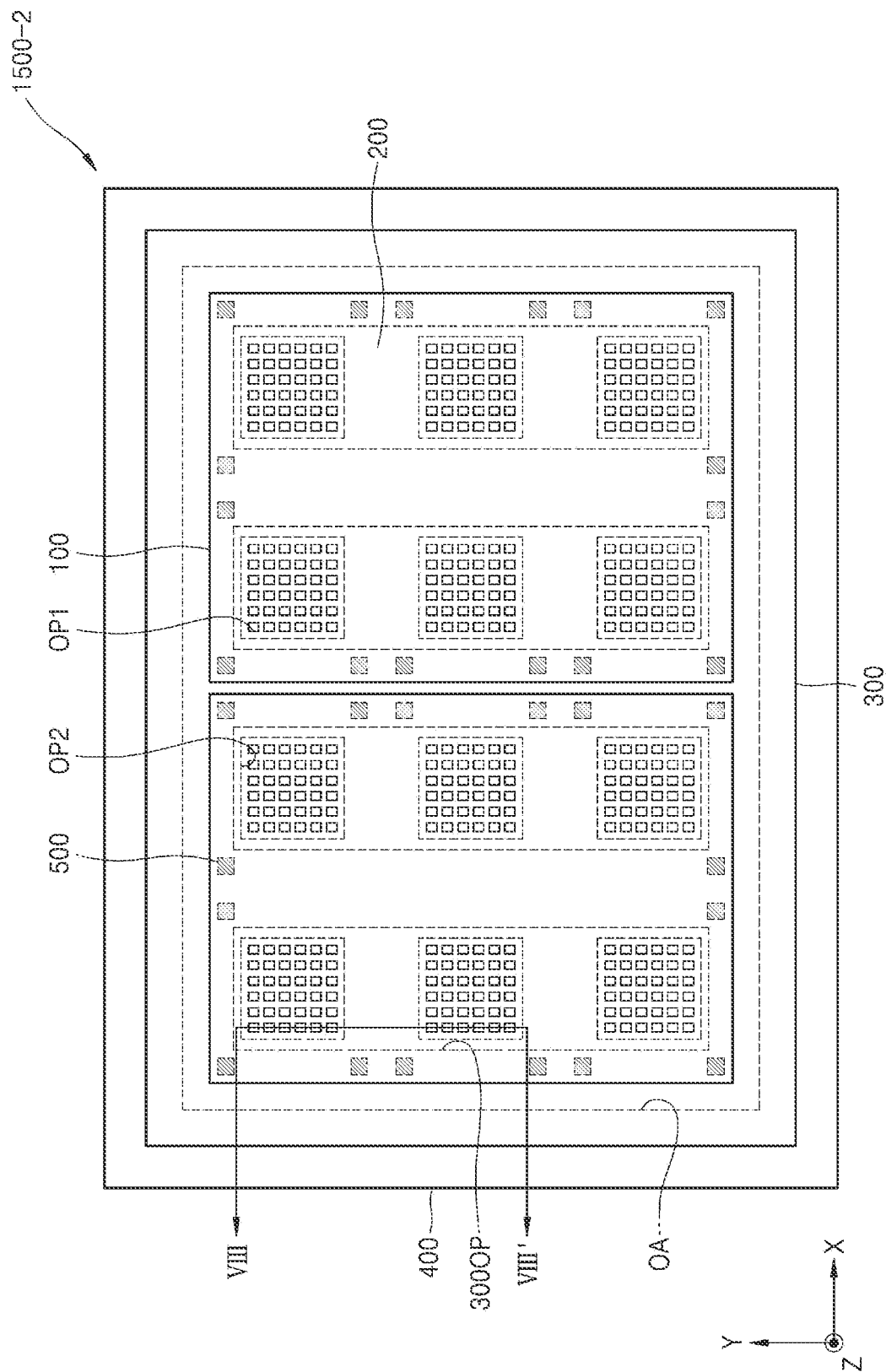

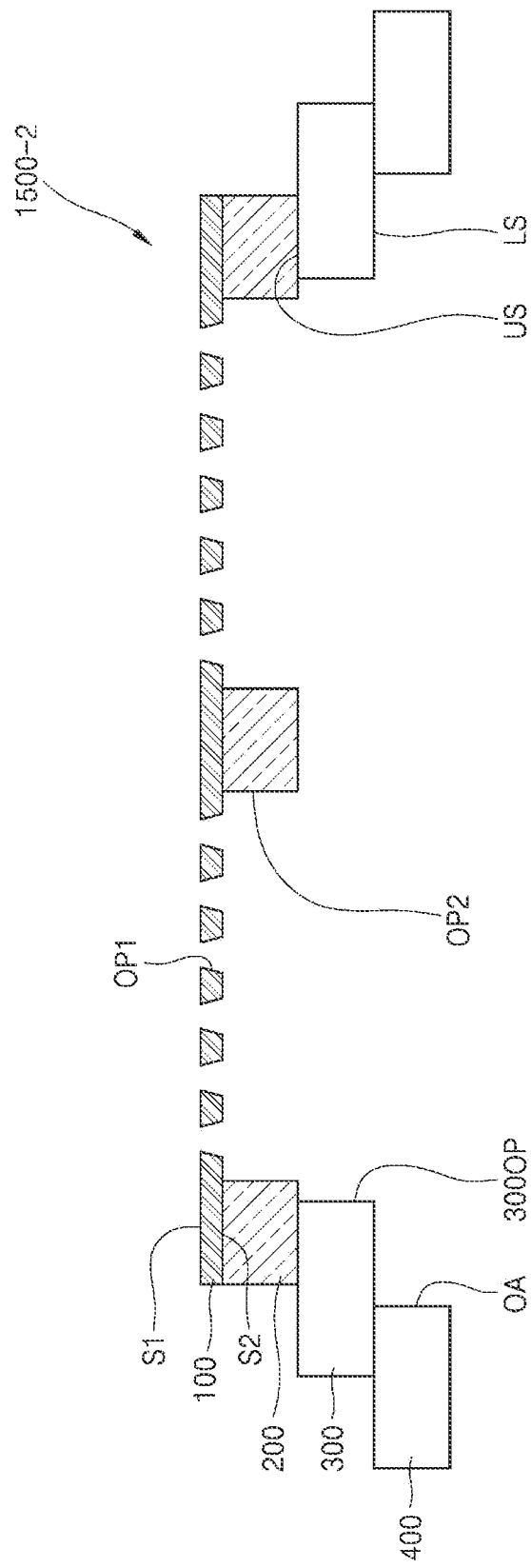

APPARATUS FOR MANUFACTURING DISPLAY DEVICE, METHOD OF MANUFACTURING MASK ASSEMBLY, AND METHOD OF MANUFACTURING DISPLAY DEVICE

CROSS-REFERENCE TO RELATED APPLICATIONS

This application is a divisional of U.S. patent application Ser. No. 17/230,867, filed Apr. 14, 2021, which claims priority to and the benefit of Korean Patent Application No. 10-2020-0099937, filed Aug. 10, 2020, the entire content of both of which is incorporated herein by reference.

BACKGROUND

1. Field

One or more embodiments of the present disclosure relate to an apparatus for manufacturing a display device, a method of manufacturing a mask assembly, and a method of manufacturing a display device.

2. Description of Related Art

As the information society develops, the demand for display devices that display images has increased in various ways. The field of display devices has rapidly changed to flat-panel displays (FPD) that are thin and lightweight and have a large screen size, replacing bulky cathode ray tube (CRT) displays. Flat-panel displays may include liquid crystal displays (LCDs), plasma display panels (PDPs), organic light-emitting device (OLED) displays, electrophoretic displays (EPDs), and the like.

Among display devices, organic light-emitting device displays may include an organic light-emitting diode including (e.g., consisting of) a counter electrode, a pixel electrode, and an emission layer. The electrodes and the emission layer may be formed by using a mask assembly.

A mask sheet including an opening portion of a mask assembly may include nickel (Ni), cobalt (Co), a nickel alloy, a nickel-cobalt alloy, and/or the like. An opening portion of a mask sheet including at least one of the above materials may be formed by using a wet etching process. Alternatively, the mask assembly may include a silicon substrate as a mask. The silicon substrate may include an opening portion, and the opening portion of the silicon substrate may be formed by a dry etching process and/or a wet etching process.

SUMMARY

Aspects of one or more embodiments are directed towards an apparatus for manufacturing a display device including a mask assembly including a silicon substrate, a method of manufacturing a mask assembly including a silicon substrate, and a method of manufacturing a display device.

Additional aspects will be set forth in part in the description which follows and, in part, will be apparent from the description, or may be learned by practice of one or more embodiments of the present disclosure.

According to one or more embodiments, in an apparatus for manufacturing a display device, the apparatus includes a mask assembly, the mask assembly including a silicon substrate having a first surface, a second surface opposite to the first surface, and a first opening portion penetrating the first surface and the second surface, and a support substrate on the second surface, the supporting substrate having a second opening portion connected to the first opening portion. The first opening portion at the first surface is less in width than the first opening portion at the second surface.

In an embodiment, the support substrate may be greater in thickness than the silicon substrate.

In an embodiment, the support substrate may be directly connected to the second surface of the silicon substrate.

In an embodiment, each of the silicon substrate and the support substrate may include a plurality of silicon atoms arranged in a first arrangement direction and a second arrangement direction, the second arrangement direction crossing the first arrangement direction. A first outer silicon atom at an outermost side from among the plurality of silicon atoms of the silicon substrate and a second outer silicon atom at an outermost side from among the plurality of silicon atoms of the support substrate may be adjacent to each other with the second surface therebetween. A third arrangement direction from the center of the first outer silicon atom to the center of the second outer silicon atom may cross the first arrangement direction and the second arrangement direction.

In an embodiment, the support substrate may include a plurality of first silicon atoms arranged in a first arrangement direction and a second arrangement direction, the second arrangement direction crossing the first arrangement direction. The silicon substrate may include a plurality of second silicon atoms arranged in the first arrangement direction and a third arrangement direction, the third arrangement direction crossing the first arrangement direction and the second arrangement direction.

In an embodiment, the second surface may include silicon monoxide ($Si_2O$).

In an embodiment, the apparatus may further include an intermediate adhesive member between the support substrate and the silicon substrate.

In an embodiment, the mask assembly may further include a mask frame having an opening area, and a mask sheet on the mask frame, the mask sheet including an upper surface, a lower surface opposite to the upper surface, and a mask opening portion penetrating the upper surface and the lower surface. The support substrate may be on the mask sheet. The second surface of the silicon substrate may face the upper surface of the mask sheet.

In an embodiment, one of the mask sheet or the support substrate may include a concave portion facing the other one of the mask sheet or the support substrate, and the apparatus may further include an adhesive member in the concave portion.

In an embodiment, the apparatus may further include a chamber having the mask assembly therein, and a source unit in the chamber, the source unit may be configured to supply a deposition material. The second surface of the silicon substrate may face the source unit.

According to one or more embodiments, a method of manufacturing a mask assembly, the method including preparing a mask substrate including a first layer, a second layer, and a third layer, forming a first opening portion in the first layer, arranging, on the first layer, a support substrate having a second opening portion connected to the first opening portion, removing the third layer, and removing the second layer.

In an embodiment, each of the first layer and the third layer may include silicon. The second layer may include silicon oxide.

In an embodiment, the forming of the first opening portion may include dry etching the first layer, and forming the first opening portion at a first surface of the first layer and a second surface opposite to the first surface, the first opening portion at the first surface may be less in width than the first opening portion at the second surface. The first surface may be a surface facing the second layer.

In an embodiment, the arranging of the support substrate may include directly connecting the first layer to the support substrate.

In an embodiment, a plurality of first opening portions may be formed in the first layer, the plurality of first opening portions including the first opening portion. The arranging of the support substrate may include connecting the second opening portion to the plurality of first opening portions.

In an embodiment, the method may further include forming a silicon oxide film on surfaces of the mask substrate and the support substrate.

In an embodiment, the method may further include removing the silicon oxide film, wherein the removing of the second layer is concurrently (e.g., simultaneously) performed with the removing of the silicon oxide film.

In an embodiment, the removing of the third layer may include polishing the third layer, and wet etching or dry etching the third layer.

In an embodiment, the arranging of the support substrate may include adhering the support substrate to the first layer by using an intermediate adhesive member.

In an embodiment, the method may further include arranging, on the support substrate, a mask sheet having a mask opening portion and a mask frame having an opening area. The first layer may include a first surface facing the second layer and a second surface opposite to the first surface. The second surface of the first layer faces the mask sheet.

According to one or more embodiments, a method of manufacturing a display device includes arranging a display substrate in a chamber, supplying a deposition material by using a source unit in the chamber, and depositing the deposition material on the display substrate by passing the deposition material through a mask assembly facing the source unit. The mask assembly may include a silicon substrate including a first surface, a second surface opposite to the first surface, and a first opening portion penetrating the first surface and the second surface, and a support substrate on the second surface, the support substrate including a second opening portion connected to the first opening portion. The first surface may face the display substrate. The second surface may face the source unit. The first opening portion at the first surface may be less in width than the first opening portion at the second surface.

In an embodiment, the support substrate may be greater in thickness than the silicon substrate.

In an embodiment, the support substrate may be directly connected to the second surface of the silicon substrate.

In an embodiment, each of the silicon substrate and the support substrate may include a plurality of silicon atoms arranged in a first arrangement direction and a second arrangement direction, the second arrangement direction crossing the first arrangement direction. A first outer silicon atom at an outermost side from among the plurality of silicon atoms of the silicon substrate and a second outer silicon atom at an outermost side of the plurality of silicon atoms of the support substrate may be adjacent to each other with the second surface therebetween. A third arrangement direction from the center of the first outer silicon atom to the center of the second outer silicon atom may cross the first arrangement direction and the second arrangement direction.

In an embodiment, the support substrate may include a plurality of first silicon atoms arranged in a first arrangement direction and a second arrangement direction, the second arrangement direction crossing the first arrangement direction. The silicon substrate may include a plurality of second silicon atoms arranged in the first arrangement direction and a third arrangement direction, the third arrangement direction crossing the first arrangement direction and the second arrangement direction.

In an embodiment, the second surface may include silicon monoxide ($Si_2O$).

In an embodiment, the method may further include an intermediate adhesive member between the support substrate and the silicon substrate.

In an embodiment, a plurality of first opening portions may include the first opening portion. The second opening portion may be connected to the plurality of first opening portions.

In an embodiment, the mask assembly may further include a mask frame having an opening area, and a mask sheet on the mask frame, the mask sheet including an upper surface, a lower surface opposite to the upper surface, and a mask opening portion penetrating the upper surface and the lower surface. The support substrate may be disposed on the mask sheet. The second surface of the silicon substrate may face the upper surface of the mask sheet.

In an embodiment, one of the mask sheet or the support substrate may include a concave portion facing the other one of the mask sheet or the support substrate. An adhesive member may be in the concave portion.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 3 is a schematic plan view of the mask assembly according to an embodiment;

FIG. 4 is a cross-sectional view of the mask assembly taken along the line IV-IV' of FIG. 3;

FIG. 7 is a schematic plan view of a mask assembly according to another embodiment;

FIG. 8 is a cross-sectional view of the mask assembly shown in FIG. 7 taken along the line VIII-VIII' of FIG. 7;

DETAILED DESCRIPTION

Figure 1:
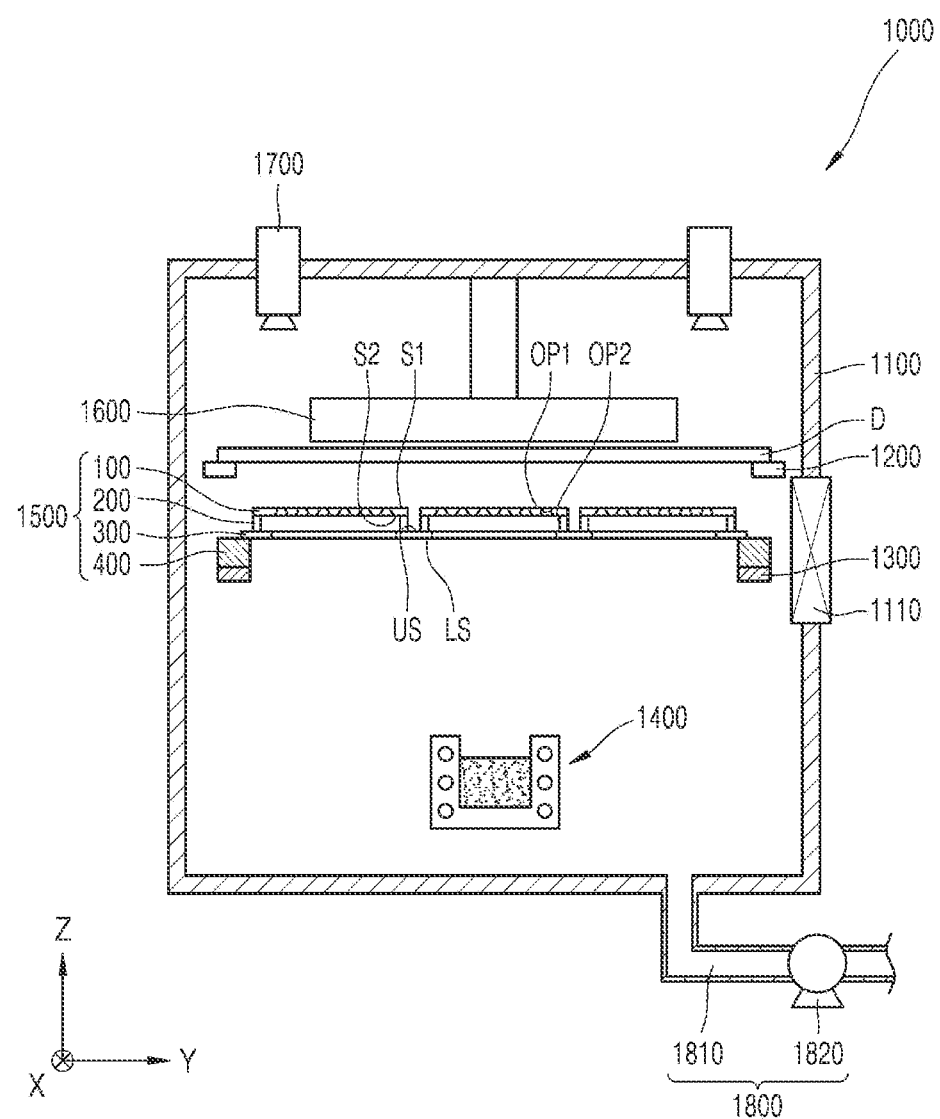
FIG. 1 is a schematic cross-sectional view of an apparatus for manufacturing a display device, according to an embodiment.

Reference will now be made in more detail to embodiments, examples of which are illustrated in the accompanying drawings, wherein like reference numerals refer to like elements throughout. In this regard, the embodiments of the present disclosure may have different forms and should not be construed as being limited to the descriptions set forth herein. Accordingly, the embodiments are merely described below, by referring to the figures, to explain aspects of one or more embodiments of the present disclosure. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, embodiments will be illustrated in the drawings and described in detail in the written description. Advantages and features of the disclosure and methods of accomplishing the same may be understood more readily by reference to the following detailed description of exemplary embodiments and the accompanying drawings. However, this is not intended to limit the disclosure to particular modes of practice, and it is to be appreciated that all changes, equivalents, and substitutes that do not depart from the spirit and technical scope of the disclosure are encompassed in the disclosure.

In the description of the disclosure, certain detailed explanations of the related art are omitted when it is deemed that they may unnecessarily obscure the essence of the disclosure.

It will be understood that although the terms "first," "second," etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "includes," "including," "comprises" and/or "comprising" used herein specify the presence of stated features, steps, operations, elements, components, and/or groups thereof, but do not preclude the presence or addition of one or more other features, steps, operations, elements, components, and/or groups thereof.

It will be understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated for convenience of explanation. In other words, because sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "connected to" another layer, region, or component, it can be directly connected to the other layer, region, or component or indirectly connected to the other layer, region, or component via intervening layers, regions, or components. For example, in the specification, when a layer, region, or component is referred to as being electrically connected to another layer, region, or component, it can be directly electrically connected to the other layer, region, or component or indirectly electrically connected to the other layer, region, or component via intervening layers, regions, or components.

Further, the use of "may" when describing embodiments of the present disclosure refers to "one or more embodiments of the present disclosure".

Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially," "about," and similar terms are used as terms of approximation and not as terms of degree, and are intended to account for the inherent deviations in measured or calculated values that would be recognized by those of ordinary skill in the art.

As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
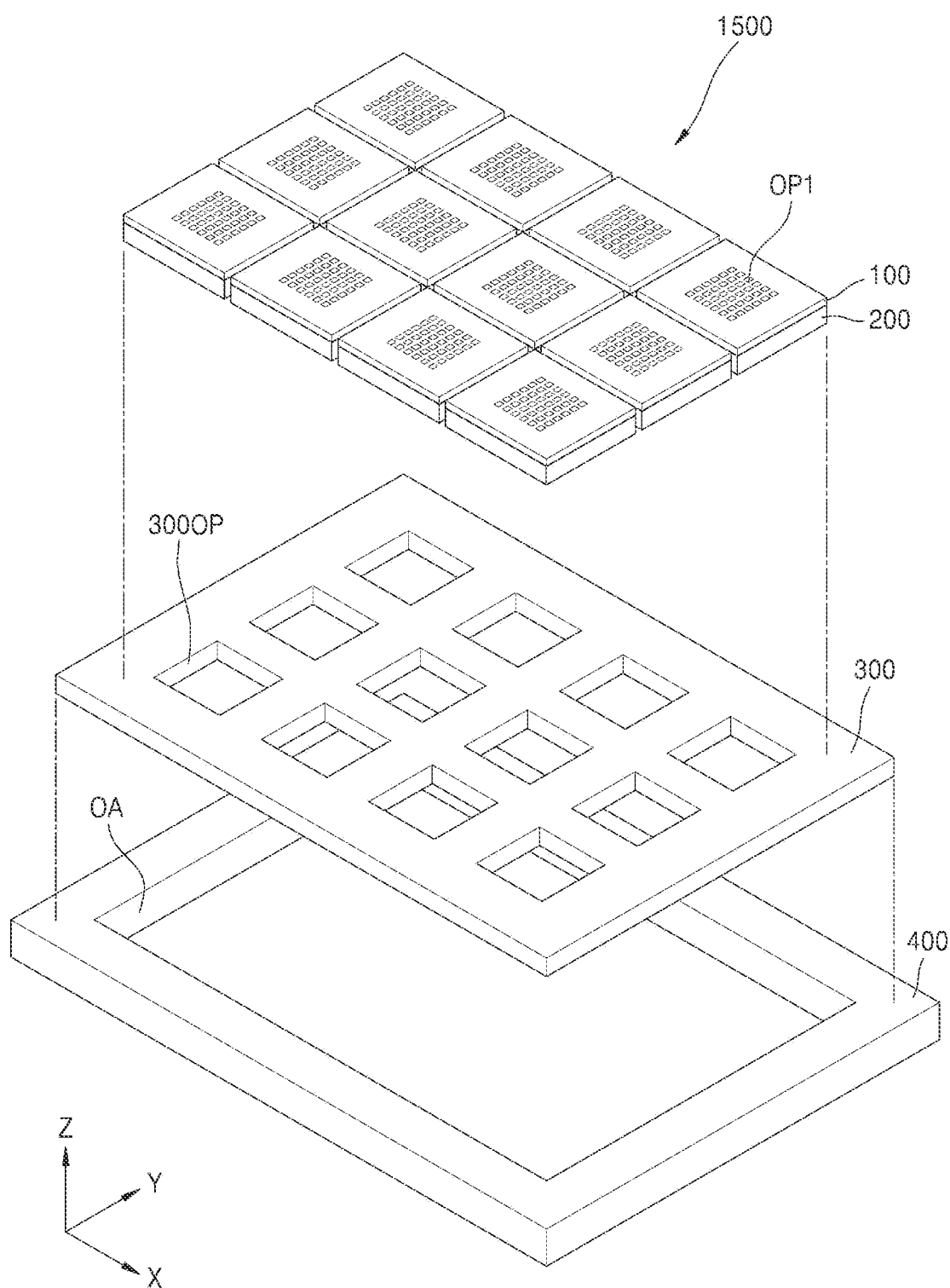
FIG. 2 is a schematic exploded perspective view of a mask assembly according to an embodiment.

FIG. 1 is a schematic cross-sectional view of an apparatus 1000 for manufacturing a display device according to an embodiment. FIG. 2 is a schematic exploded perspective view of a mask assembly 1500 according to an embodiment; FIG. 3 is a schematic plan view of the mask assembly according to an embodiment. FIG. 4 is a cross-sectional view of the mask assembly 1500 taken along the line IV-IV' of FIG. 3.

Referring to FIGS. 1-4, the apparatus 1000 for manufacturing a display device may include a chamber 1100, a substrate support 1200, a mask support 1300, a source unit 1400, a mask assembly 1500, an electromagnetic unit 1600, a vision unit 1700, and a pressure control unit 1800.

The chamber 1100 may have a space (e.g., an internal volume) therein and one open side (e.g., an opening at a side of the chamber 1100) through which a display substrate D may be withdrawn or loaded. A shield part 1110 including a gate valve and/or the like may be disposed at the open side of the chamber 1100 so as to be selectively opened or closed.

The substrate support 1200 may support the display substrate D that is placed thereon. For example, the substrate support 1200 may passively support the display substrate D that is placed thereon, support the display substrate D by applying suction at one surface of the display substrate D, or support the display substrate D by allowing the surface of the display substrate D to adhere to the substrate support 1200. In an embodiment, the substrate support 1200 may be provided in the form of a bracket fixed to the inside of the chamber 1100. However, the present disclosure is not limited thereto. For example, in another embodiment, the substrate support 1200 may be in the form of a shuttle capable of a linear motion in the chamber 1100, and the display substrate D may be placed or positioned in or on the substrate support 1200. In the following description, for convenience of explanation, a case in which the substrate support 1200 is in the form of a bracket that is fixed to the inside of the chamber 1100 is described in more detail.

The mask assembly 1500 may be placed on the mask support 1300. The mask support 1300 may be disposed in the chamber 1100. The mask support 1300 may be in the form of a bracket fixed to the inside of the chamber 1100. In an embodiment, the mask support 1300 may adjust (e.g., finely adjust) the position of the mask assembly 1500. In this case, the mask support 1300 may include a separate driving unit, an alignment unit, and/or the like to move the mask assembly 1500 in different directions.

The source unit 1400 may be disposed to face the mask assembly 1500. The source unit 1400 may contain a deposition material, and the deposition material may be vaporized or sublimated by applying heat to the deposition material. Accordingly, the source unit 1400 may supply the deposition material.

The mask assembly 1500 may be supported by the mask support 1300. The mask assembly 1500 may include a silicon substrate 100, a support substrate 200, a mask sheet 300, a mask frame 400, and an adhesive member 500.

The silicon substrate 100 may be disposed on the support substrate 200. For example, the silicon substrate 100 may be disposed closer to the display substrate D and/or the electromagnetic unit 1600 than the support substrate 200 is to the display substrate D and/or the electromagnetic unit 1600. The silicon substrate 100 may be disposed farther from the source unit 1400 than the support substrate 200 is from the source unit 1400.

In an embodiment, the silicon substrate 100 may be connected (e.g., directly connected) to the support substrate 200. For example, the silicon substrate 100 may be connected to the support substrate 200 via an intermediate adhesive member, and in other embodiments, the silicon substrate 100 may be directly connected to the support substrate 200. In the following description, a case in which the silicon substrate 100 is directly connected to the support substrate 200 is described in more detail.

The silicon substrate 100 may include a plurality of silicon substrates on the mask sheet 300 that is a single mask sheet. In an embodiment, the silicon substrates 100 may be disposed apart from or spaced from each other on the mask sheet 300 (e.g., a mask sheet that is a single mask sheet). For example, the silicon substrates 100 may be disposed on the mask sheet 300 (e.g., the mask sheet 300 that is a single mask sheet), apart from or spaced from each other in a first direction (e.g., an X direction or a −X direction), and/or apart from or spaced from each other in a second direction (e.g., a Y direction or a −Y direction). In another embodiment, at least part of the silicon substrates 100 may be integrally provided on the mask sheet 300 that is a single mask sheet.

The silicon substrate 100 may be disposed to correspond to a mask opening portion 300OP of the mask sheet 300. In other words, the silicon substrate 100 may overlap (e.g., overlap in the third direction (e.g., the Z direction or the −Z direction)) the mask opening portion 300OP of the mask sheet 300. In an embodiment, the silicon substrate 100 may include a plurality of silicon substrates on the mask sheet 300 that is a single mask sheet. Furthermore, the mask sheet 300 may include a plurality of mask opening portions as the mask opening portion 300OP. In this case, the silicon substrates 100 may be respectively disposed to correspond to the mask opening portions 300OP. In other words, the silicon substrates 100 may respectively overlap the mask opening portions 300OP.

The silicon substrate 100 may include a first surface S1 and a second surface S2 opposite to the first surface S1. The first surface S1 may be disposed to face the electromagnetic unit 1600 and/or the display substrate D. The second surface S2 may be disposed to face the source unit 1400. Furthermore, the second surface S2 may be disposed to face an upper surface US of the mask sheet 300.

The silicon substrate 100 may include a first opening portion OP1. The first opening portion OP1 may penetrate the first surface S1 and the second surface S2. In one or more embodiments, the first opening portion OP1 may extend through the second surface S2. The first opening portion OP1 may have a tapered shape (e.g., the opening portion OP1 may be defined by tapered sidewalls). In an embodiment, a first width d1 of the first opening portion OP1 in the first surface S1 may be less than a second width d2 of a first opening portion OP1 in the second surface S2. The first width d1 may be defined to be the shortest distance between inner side surfaces of the silicon substrate 100 facing each other and defining the first opening portion OP1 in the first surface S1. The second width d2 may be defined to be the shortest distance between inner side surfaces of the silicon substrate 100 facing each other and defining the first opening portion OP1 in the second surface S2. As the first surface S1 faces the display substrate D, the width of the first opening portion OP1 may decrease in a direction from the source unit 1400 towards the display substrate D. In this case, the silicon substrate 100 may precisely control a position where the deposition material is deposited on the display substrate D in the apparatus 1000 for manufacturing a display device. Accordingly, machining precision of the apparatus 1000 for manufacturing a display device may be improved.

In an embodiment, the width of the first opening portion OP1 may decrease constantly. For example, the width of the first opening portion OP1 may constantly decrease in a direction from the second surface S2 toward the first surface S1. In another embodiment, the inner side surface of the first opening portion OP1 may include a curved surface. In the following description, a case in which the width of the first opening portion OP1 decreases constantly is described in more detail.

When the first opening portion OP1 is formed perpendicularly or normally without being tapered, unlike one or more embodiments of the present disclosure, and the apparatus 1000 for manufacturing a display device repeats or performs the deposition process, the first opening portion OP1 may become clogged with the deposition material supplied by the source unit 1400. In this case, the cycle of a cleaning process to remove the deposition material deposited in or clogging the first opening portion OP1 may be shortened. As the amount of the deposition material used by the source unit 1400 increases, the efficiency (e.g., throughput) of the apparatus 1000 for manufacturing a display device may be reduced. For example, the efficiency may be reduced by having to perform the cleaning process more frequently and/or for a longer duration of time. In one or more embodiments of the present disclosure, the first width d1 of the first opening portion OP1 in the first surface S1 may be less than the second width d2 of the first opening portion OP1 in the second surface S2. For example, the first opening portion OP1 may be tapered. Accordingly, the time (duration of time) until the first opening portion OP1 is clogged with the deposition material supplied by the source unit 1400 may increase compared to a case in which the first opening portion OP1 is not tapered. Accordingly, the efficiency of the apparatus 1000 for manufacturing a display device may increase.

The silicon substrate 100 may include silicon (Si). In an embodiment, the silicon substrate 100 may include silicon crystal. For example, the silicon substrate 100 may include a plurality of silicon atoms. In other words, the silicon substrate 100 may be a silicon wafer. As the silicon substrate 100 is a silicon wafer, the first opening portion OP1 may be formed by a dry etching process, which is described in more detail below.

The support substrate 200 may support the silicon substrate 100. The support substrate 200 may be disposed on the second surface S2 of the silicon substrate 100. The support substrate 200 may be disposed between the silicon substrate 100 and the mask sheet 300. Furthermore, the support substrate 200 may be disposed farther from the display substrate D and/or the electromagnetic unit 1600 than the silicon substrate 100 is from the display substrate D and/or the electromagnetic unit 1600. The support substrate 200 may be disposed closer to the source unit 1400 than the silicon substrate 100 is to the source unit 1400.

A second thickness t2 of the support substrate 200 may be greater than a first thickness t1 of the silicon substrate 100. The second thickness t2 of the support substrate 200 may be defined to be the shortest distance between an upper surface of the support substrate 200 and a lower surface of the support substrate 200. The first thickness t1 of the silicon substrate 100 may be defined to be the shortest distance between the first surface S1 of the silicon substrate 100 and the second surface S2 of the silicon substrate 100. During manufacturing of the mask assembly 1500, when a robot arm and/or the like contacts (e.g., directly contacts) and transfers the silicon substrate 100, the silicon substrate 100 may be damaged. During the manufacture of the mask assembly 1500, when a robot arm and/or the like contacts (e.g., directly contacts) and transfers the support substrate 200 having a thickness greater than that of the silicon substrate 100, damage to the silicon substrate 100 may be prevented or reduced.

In an embodiment, the support substrate 200 may include a plurality of support substrates on the mask sheet 300 (e.g., a mask sheet that is a single mask sheet). In an embodiment, the support substrates 200 may be disposed apart from or spaced from each other on the mask sheet 300 (e.g., a mask sheet that is a single mask sheet). For example, the support substrates 200 may be disposed apart from or spaced from each other on the mask sheet 300 (e.g., a mask sheet that is a single mask sheet) in the first direction (e.g., the X direction or the −X direction), and/or in the second direction (e.g., the Y direction or the −Y direction).

The support substrate 200 may be disposed to correspond to the mask opening portion 300OP of the mask sheet 300. In other words, the support substrate 200 may overlap (e.g., overlap in the third direction (e.g., the Z direction or the −Z direction)) the mask opening portion 300OP of the mask sheet 300. In an embodiment, the support substrate 200 may include a plurality of support substrates on the mask sheet 300 that is a single mask sheet. Furthermore, the mask sheet 300 may include a plurality of mask opening portions as the mask opening portion 300OP. In this case, the support substrates 200 may be respectively disposed to correspond to the mask opening portions 300OP. In other words, the support substrates 200 may respectively overlap the mask opening portions 300OP.

The support substrate 200 may include the second opening portion OP2. The second opening portion OP2 may penetrate the upper surface of the support substrate 200 and the lower surface of the support substrate 200. For example, the second opening portion OP2 may extend through the support substrate 200. In an embodiment, the second opening portion OP2 may be connected to (communicated with) the first opening portion OP1. Accordingly, the deposition material supplied by the source unit 1400 may be deposited on the display substrate D by passing through the second opening portion OP2 and the first opening portion OP1. In an embodiment, the second opening portion OP2 may be connected to the first opening portions OP1. In other words, the second opening portion OP2 that is a single opening portion may be connected to each of the first opening portions OP1.

In an embodiment, the support substrate 200 may include silicon. In other words, the support substrate 200 may include silicon crystal. For example, the support substrate 200 may include a plurality of silicon atoms. In this case, the support substrate 200 may be a silicon wafer, and may include the same material as the silicon substrate 100. In another embodiment, the support substrate 200 may include glass.

The support substrate 200 may be connected (e.g., directly connected) to the silicon substrate 100. For example, in one or more embodiments, the support substrate 200 may be directly connected to the second surface S2 of the silicon substrate 100. The support substrate 200 being directly connected to the second surface S2 of the silicon substrate 100 may refer to an adhesive member and/or the like not being disposed between the support substrate 200 and the silicon substrate 100. The support substrate 200 may be bonded and directly connected to the silicon substrate 100. When both of the support substrate 200 and the silicon substrate 100 include silicon crystal, the support substrate 200 and the silicon substrate 100 may be bonded (e.g., directly bonded or fusion bonded) to each other. In this case, in an embodiment, the second surface S2, to which the support substrate 200 and the silicon substrate 100 are directly connected, may include silicon monoxide ($Si_2O$). In another example, when the support substrate 200 includes glass, the support substrate 200 and the silicon substrate 100 may be anodic bonded.

The mask sheet 300 may be disposed below the support substrate 200. The support substrate 200 may be disposed on the mask sheet 300. In one or more embodiments, the support substrate 200 may be disposed between the mask sheet 300 and the silicon substrate 100. Furthermore, the mask sheet 300 may be disposed on the mask frame 400. The mask sheet 300 may be disposed between the mask frame 400 and the support substrate 200.

The mask sheet 300 may include the upper surface US and a lower surface LS opposite to the upper surface US. The upper surface US of the mask sheet 300 may correspond to the second surface S2 of the silicon substrate 100. Furthermore, the upper surface US of the mask sheet 300 may correspond to the support substrate 200. The lower surface LS of the mask sheet 300 may correspond to the mask support 1300 and/or the source unit 1400.

The mask sheet 300 may include the mask opening portion 300OP. The mask opening portion 300OP may penetrate the upper surface US of the mask sheet 300 and the lower surface LS of the mask sheet 300. In one or more embodiments, the mask opening portion 300OP may extend through the mask sheet 300. Furthermore, the mask opening portion 300OP may be connected to the second opening portion OP2. In an embodiment, the mask sheet 300 may include the mask opening portions 300OP. In this case, the mask opening portions 300OP may be respectively connected to the second opening portions OP2.

In an embodiment, the width of the mask opening portion 300OP may be the same as (equal to) or substantially the same as (substantially equal to) the width of the second opening portion OP2. In another embodiment, the width of the mask opening portion 300OP may be different from the width of the second opening portion OP2. For example, the width of the mask opening portion 300OP may be greater or less than the width of the second opening portion OP2.

The mask sheet 300 may include stainless steel, invar, Ni, Co, a nickel alloy, and/or a nickel-cobalt alloy. Accordingly, when the electromagnetic unit 1600 applies an electric force and/or a magnetic force to the mask sheet 300, the mask sheet 300 may approach in a direction close to the electromagnetic unit 1600. In this case, the silicon substrate 100 may be in contact (e.g., close contact) with the display substrate D.

One of the support substrate 200 and the mask sheet 300 may include a concave portion CP facing the other one of the support substrate 200 and the mask sheet 300. In an embodiment, the support substrate 200 may include the concave portion CP facing the mask sheet 300 (e.g., a surface of the mask sheet 300). In this case, the concave portion CP of the support substrate 200 may face the upper surface US of the mask sheet 300. In another embodiment, the mask sheet 300 may include a concave portion facing the support substrate 200 (e.g., a surface of the support substrate 200). In another embodiment, the support substrate 200 may include the concave portion CP facing the mask sheet 300, and the mask sheet 300 may include a concave portion facing the support substrate 200. For example, the concave portion CP of the support substrate 200 may face the concave portion CP of the mask sheet 300. In the following description, a case in which the support substrate 200 includes the concave portion CP facing the mask sheet 300 is described in more detail.

In an embodiment, the support substrate 200 may include the concave portions CP. The concave portions CP may be disposed to correspond to apexes of the support substrate 200. Alternatively, the concave portions CP may be disposed to correspond to the apexes of the support substrate 200 and/or sides of the support substrate 200.

The adhesive member 500 may be disposed in the concave portion CP. The adhesive member 500 may bond the support substrate 200 and the mask sheet 300. In an embodiment, the adhesive member 500 may include adhesive metal. The adhesive member 500 may include a material that does not generate outgassing. For example, the adhesive member 500 may include indium (In). Alternatively, the adhesive member 500 may include an In complex. In another example, the adhesive member 500 may include resin, epoxy, and/or the like.

The mask frame 400 may be disposed below the mask sheet 300. In other words, the mask sheet 300 may be disposed on the mask frame 400. The mask sheet 300 may be disposed between the support substrate 200 and the mask frame 400. The mask sheet 300 may be fixed to the mask frame 400 in a tensile state. The mask sheet 300 may be fixed to the mask frame 400 by welding. The mask frame 400 may be placed on the mask support 1300.

The mask frame 400 may include an opening area OA. The opening area OA of the mask frame 400 may be overlapped with the mask sheet 300. Furthermore, the opening area OA may be connected to the mask opening portion 300OP of the mask sheet 300. In an embodiment, the opening area OA may be connected to the mask opening portions 300OP. The deposition material supplied by the source unit 1400 may pass through the opening area OA. The mask frame 400 may include a plurality of frames surrounding the opening area OA. The frames may extend in the first direction (e.g., the X direction or the −X direction) and/or in the second direction (e.g., the Y direction or the −Y direction). The mask frame 400 may include a material that is less deformable (i.e., not easily deformed), that is, metal with high rigidity.

The electromagnetic unit 1600 may be dispose at the side opposite to the source unit 1400 with respect to the mask assembly 1500. The electromagnetic unit 1600 may apply a force to the mask assembly 1500 toward the display substrate D by applying an electric force and/or a magnetic force to the mask sheet 300. In particular, the electromagnetic unit 1600 may prevent or reduce sagging of the mask sheet 300, and further allow the mask sheet 300 to approach the display substrate D. Furthermore, the electromagnetic unit 1600 may maintain a constant interval between the mask sheet 300 and the display substrate D with respect to a length direction of the mask sheet 300. In an embodiment, the electromagnetic unit 1600 may include an electrostatic chuck. In another embodiment, the electromagnetic unit 1600 may include a magnetic chuck.

The vision unit 1700 is disposed in the chamber 1100, and may photograph the positions of the display substrate D and the mask assembly 1500. The vision unit 1700 may include a camera to photograph the display substrate D and the mask assembly 1500. The positions of the display substrate D and the mask assembly 1500 may be identified on the basis of (based on) an image captured by the vision unit 1700, and the position of the mask assembly 1500 may be adjusted (e.g., finely adjusted) on the mask support 1300 on the basis of (based on) the image (e.g., based the positions of the display substrate D and the mask assembly 1500 identified using the image).

The pressure control unit 1800 is connected to the chamber 1100 and may adjust a pressure in the chamber 1100. For example, the pressure control unit 1800 may adjust the pressure in the chamber 1100 to be identical or similar to the atmospheric pressure. Furthermore, the pressure control unit 1800 may adjust the pressure in the chamber 1100 to be identical or similar to a vacuum state.

The pressure control unit 1800 may include a connection pipe 1810 connected to the chamber 1100 and a pump 1820 provided on the connection pipe 1810. According to the operation of the pump 1820, external air may be introduced or supplied through the connection pipe 1810 or a gas in the chamber 1100 may be guided or purged to the outside through the connection pipe 1810.

Figure 5A:
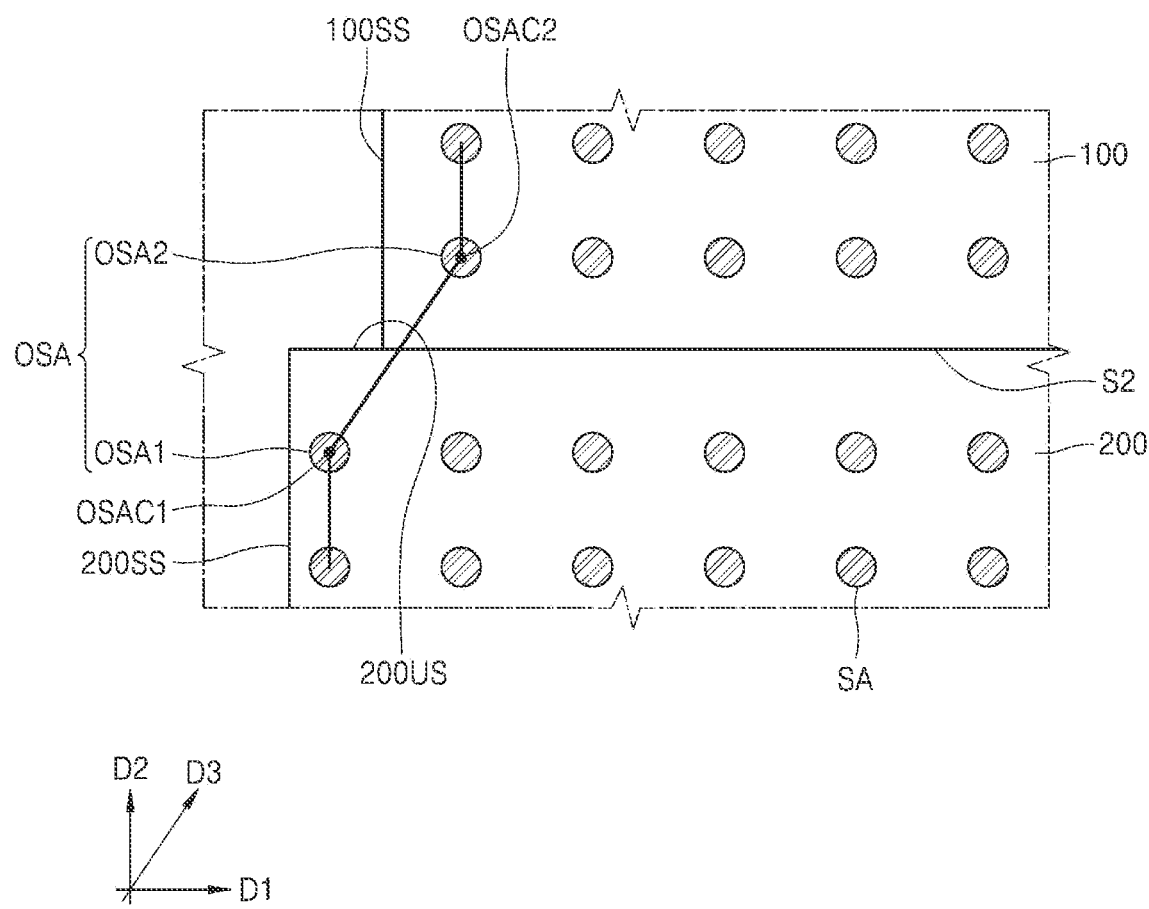
FIG. 5A is an enlarged view of portion A of the mask assembly of FIG. 4, according to an embodiment.

FIG. 5A is an enlarged view of portion A of the mask assembly 1500 of FIG. 4, according to an embodiment.

Referring to FIG. 5A, the mask assembly 1500 may include the silicon substrate 100 and the support substrate 200. The upper surface 200US of the support substrate 200 may face the second surface S2 of the silicon substrate 100. In an embodiment, the upper surface 200US of the support substrate 200 may be partially exposed to the outside as shown in FIG. 5A. For example, the support substrate 200 may extend farther in a direction parallel to the second surface S2 than the silicon substrate 100 extends in the direction parallel to the second surface S2. In this case, the support substrate 200 may protrude in the direction parallel to the second surface S2. In another embodiment, the second surface S2 of the silicon substrate 100 may be partially exposed to the outside. For example, the silicon substrate 100 may extend farther in a direction parallel to the second surface S2 than the support substrate 200 extends in the direction parallel to the second surface S2. In this case, the silicon substrate 100 may protrude in a direction parallel to the second surface S2. As such, when the silicon substrate 100 and the support substrate 200 are directly connected to each other, a side surface 100SS of the silicon substrate 100 may not be aligned to a side surface 200SS of the support substrate 200. The side surface 100SS of the silicon substrate 100 may intersect the second surface S2 of the silicon substrate 100, and may be exposed to the outside. The side surface 200SS of the support substrate 200 may intersect the upper surface 200US of the support substrate 200 and may be exposed to the outside.

The silicon substrate 100 and the support substrate 200 each may include a plurality of silicon atoms SA. The silicon atoms SA may be arranged in a first arrangement direction D1 and a second arrangement direction D2 as shown in FIG. 5A. The first arrangement direction D1 and the second arrangement direction D2 may intersect with each other. For example, the first arrangement direction D1 and the second arrangement direction D2 may form an acute angle, a right angle, or an obtuse angle. In the following description, a case in which the first arrangement direction D1 and the second arrangement direction D2 form a right angle is described in more detail.

A plurality of outer silicon atoms disposed at the outermost side (e.g., outermost sides of the silicon substrate 100 and the support substrate 200) among the silicon atoms SA may be defined to be a plurality of outer silicon atoms (OSA). In other words, the outer silicon atoms OSA may be defined to be silicon atoms dispose at the outermost side among the silicon atoms SA. In an embodiment, the outer silicon atoms OSA included in the silicon substrate 100 may define the side surface 100SS of the silicon substrate 100. Furthermore, the outer silicon atoms OSA included in the support substrate 200 may define the side surface 200SS of the support substrate 200.

The silicon atoms SA may include a first outer silicon atom OSA1 (e.g., an outer silicon atom of the support substrate 200) and a second outer silicon atom OSA2 (e.g., an outer silicon atom of the silicon substrate 100) which are disposed at the outermost side of the silicon atoms SA and adjacent to each other with the second surface S2 therebetween. For example, the outer silicon atoms OSA may include the first outer silicon atom OSA1 and the second outer silicon atom OSA2 that are adjacent to each other with the second surface S2 therebetween. In other words, a first outer silicon atom located at an outermost side from among the plurality of silicon atoms of the silicon substrate and a second outer silicon atom located at an outermost side from among the plurality of silicon atoms of the support substrate are adjacent to each other with the second surface therebetween.

A third arrangement direction D3 from a center OSAC1 of the first outer silicon atom OSA1 to a center OSAC2 of the second outer silicon atom OSA2 may intersect or cross the first arrangement direction D1 and the second arrangement direction D2. The center OSAC1 of the first outer silicon atom OSA1 may be defined to be a position of an atomic nucleus of the first outer silicon atom OSA1. Furthermore, the center OSAC2 of the second outer silicon atom OSA2 may be defined to be a position of an atomic nucleus of the second outer silicon atom OSA2. In other words, the silicon atoms SA included in the silicon substrate 100 and the silicon atoms SA included in the support substrate 200 may be dislocated from or offset from each other as shown in FIG. 5A. This is because, even when the silicon substrate 100 and the support substrate 200 include the same silicon crystal and are directly connected to each other, the atomic bonds between the silicon substrate 100 and the support substrate 200 may not perfectly match (e.g., may not be aligned) with each other.

Figure 5B:
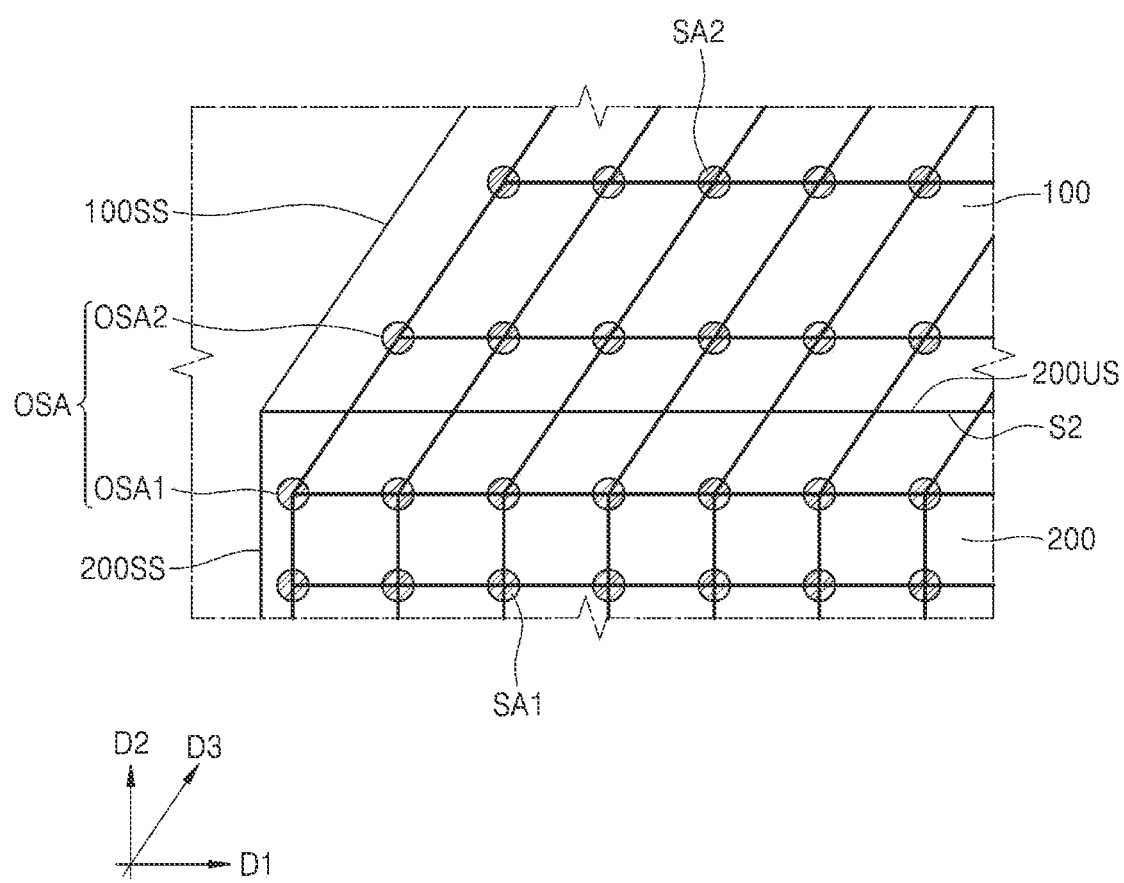
FIG. 5B is an enlarged view of portion A of the mask assembly of FIG. 4, according to another embodiment.

FIG. 5B is an enlarged view of portion A of the mask assembly 1500 of FIG. 4, according to another embodiment. In FIG. 5B, as the same reference numerals as those of FIG. 5A denote the same elements, and therefore, redundant descriptions thereof may not be repeated.

Referring to FIG. 5B, the mask assembly 1500 may include the silicon substrate 100 and the support substrate 200.

When the silicon substrate 100 and the support substrate 200 are directly connected to each other, the side surface 100SS of the silicon substrate 100 and the side surface 200SS of the support substrate 200 may intersect with each other. In other words, the side surface 100SS of the silicon substrate 100 and the side surface 200SS of the support substrate 200 are not included in the same plane and may intersect with each other.

The silicon substrate 100 and the support substrate 200 each may include the silicon atoms SA. For example, the support substrate 200 may include a plurality of first silicon atoms SA1, and the silicon substrate 100 may include a plurality of second silicon atoms SA2.

In an embodiment, the first silicon atoms SA1 may be arranged the first arrangement direction D1 and the second arrangement direction D2 intersecting or crossing the first arrangement direction D1. The first arrangement direction D1 and the second arrangement direction D2 may intersect with or cross each other to form any suitable angle. For example, the first arrangement direction D1 and the second arrangement direction D2 may form an acute angle, a right angle, or an obtuse angle. In the following description, a case in which the first arrangement direction D1 and the second arrangement direction D2 form a right angle is described in more detail.

In an embodiment, the second silicon atoms SA2 may be arranged in the first arrangement direction D1 and the third arrangement direction D3 intersecting or crossing the first arrangement direction D1 and the second arrangement direction D2. Accordingly, the arrangement direction of the first silicon atoms SA1 and the arrangement direction of the second silicon atoms SA2 may be different from each other. In other words, an interfacial defect may be generated in the second surface S2 of the silicon substrate 100. The interfacial defect may be defined to be a two dimensional interface for separating two parts of a material having different crystal structures and different crystal directions.

Figure 5C:
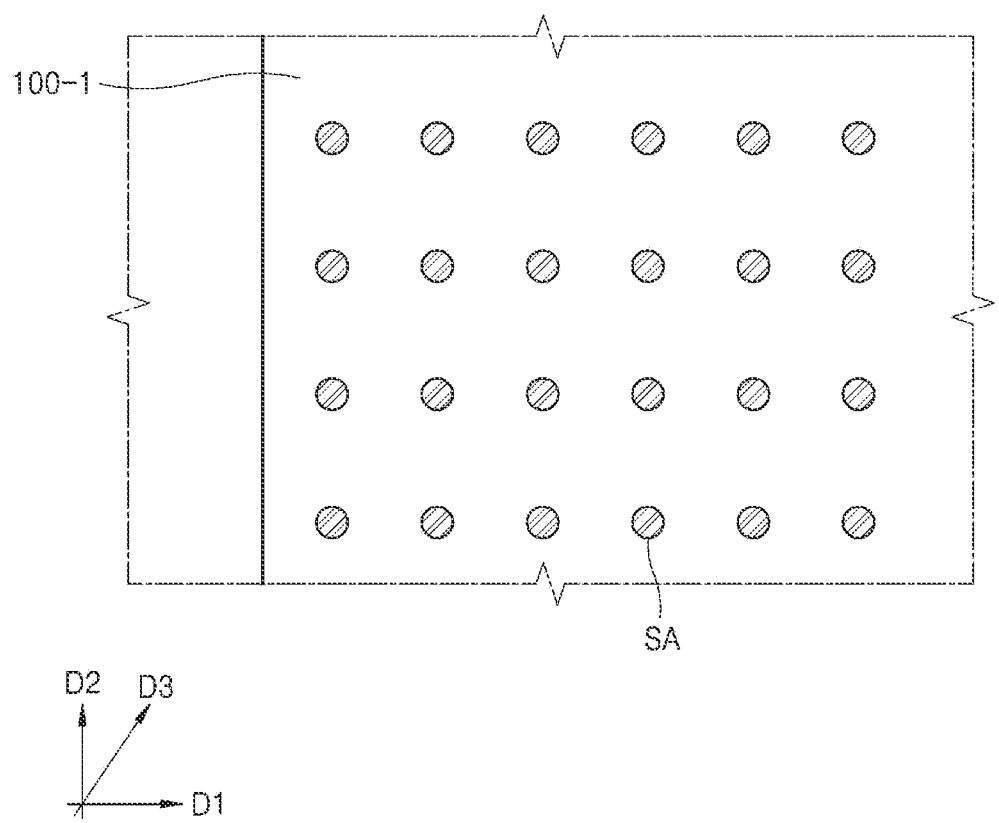
FIG. 5C is an enlarged view of portion A of FIG. 4, according to a comparative example, for comparison with the embodiments of FIGS. 5A and 5B.

FIG. 5C is an enlarged view of the portion A of FIG. 4, according to a comparative example, for comparison with the embodiments of FIGS. 5A and 5B.

Referring to FIG. 5C, in the comparative example, the mask assembly may include a silicon substrate 100-1. In this case, however, the mask assembly may not include a support substrate. The silicon substrate 100-1 may include the silicon atoms SA. The silicon atoms SA may be arranged in the first arrangement direction D1 and the second arrangement direction D2.

When the silicon substrate 100-1 is not directly connected to the support substrate, unlike according to one or more embodiments of the present disclosure, the silicon atoms SA may be regularly arranged. In other words, the silicon atoms SA included in the silicon substrate 100-1 may not be dislocated as illustrated in FIG. 5A. Alternatively, an interfacial defect as illustrated in FIG. 5B may not be generated in the silicon atoms SA included in the silicon substrate 100-1. In one or more embodiments of the present disclosure, as the silicon substrate 100 and the support substrate 200 are directly connected to each other, the silicon atoms SA may be dislocated as illustrated in FIG. 5A, and/or an interfacial defect may be generated as illustrated in FIG. 5B.

Figure 6:
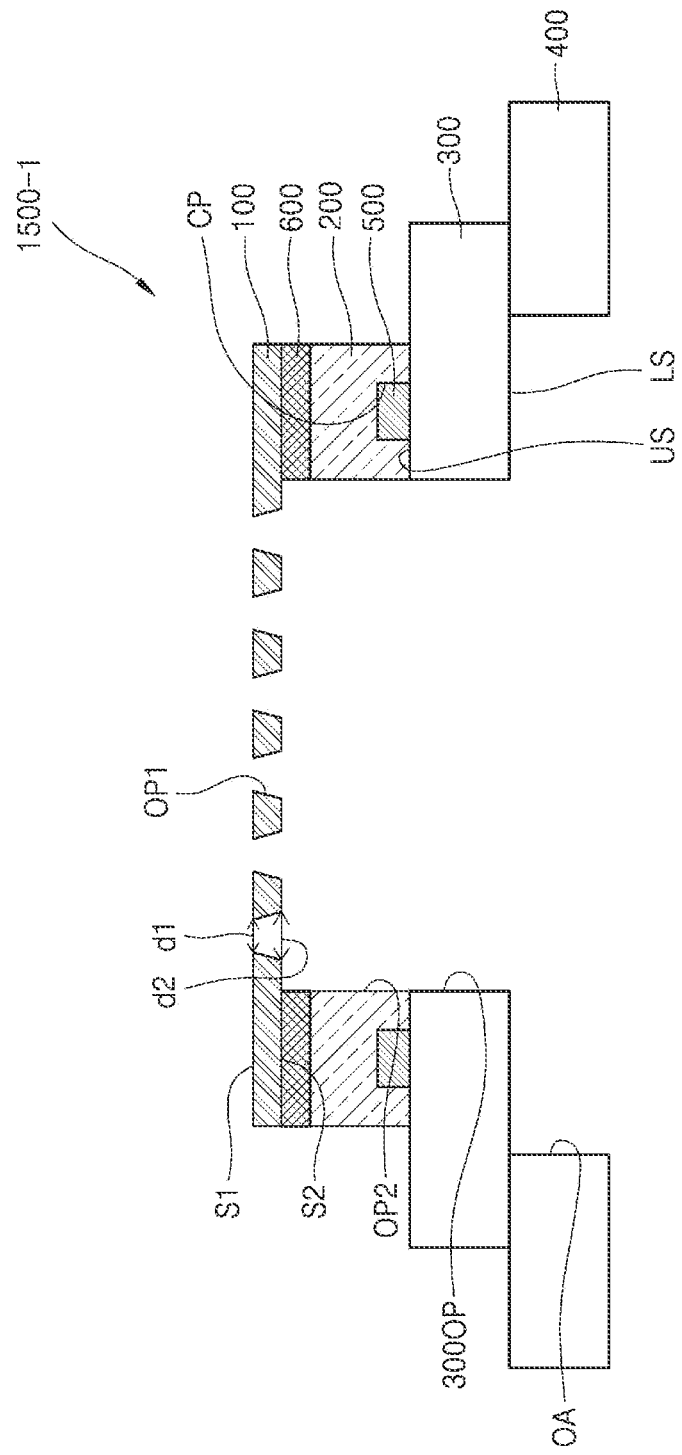
FIG. 6 is a cross-sectional view of a mask assembly according to another embodiment.

FIG. 6 is a cross-sectional view of a mask assembly 1500-1 according to another embodiment. In FIG. 6, as the same reference numerals as those of FIG. 4 denote the same elements, and therefore, redundant descriptions thereof may not be repeated.

Referring to FIG. 6, the mask assembly 1500-1 may include the silicon substrate 100, the support substrate 200, the mask sheet 300, the mask frame 400, the adhesive member 500, and an intermediate adhesive member 600. The mask assembly 1500-1 according to the embodiment of FIG. 6 is different from the mask assembly 1500 according to the embodiment of FIG. 4 in that the former includes the intermediate adhesive member 600.

In an embodiment, the support substrate 200 may include silicon. For example, the support substrate 200 may include silicon crystal. In another embodiment, the support substrate 200 may include glass.

The intermediate adhesive member 600 may be disposed between the silicon substrate 100 and the support substrate 200. The intermediate adhesive member 600 may bond the silicon substrate 100 and the support substrate 200. In an embodiment, the intermediate adhesive member 600 may include adhesive metal. The intermediate adhesive member 600 may include a material that does not generate outgassing. For example, the intermediate adhesive member 600 may include In. Alternatively, the intermediate adhesive member 600 may include an indium complex. In another example, the intermediate adhesive member 600 may include resin, epoxy, and/or the like.

FIG. 7 is a schematic plan view of a mask assembly 1500-2 according to another embodiment. FIG. 8 is a cross-sectional view of the mask assembly 1500-2 shown in FIG. 7 taken along the line VIII-VIII' of FIG. 7. In FIGS. 7 and 8, as the same reference numerals as those of FIGS. 3 and 4 denote the same elements, and therefore, redundant descriptions thereof may not be repeated.

Referring to FIGS. 7 and 8, the mask assembly 1500-2 may include the silicon substrate 100, the support substrate 200, the mask sheet 300, the mask frame 400, and the adhesive member 500.

The silicon substrate 100 may include the first opening portion OP1. The first opening portion OP1 may penetrate the first surface S1 and the second surface S2. In one or more embodiments, the first opening portion OP1 may extend through the silicon substrate 100. The first opening portion OP1 may have a tapered shape. The first opening portion OP1 may include a plurality of first opening portions.

The support substrate 200 may include the second opening portion OP2. The second opening portion OP2 may penetrate the upper surface of the support substrate 200 and the lower surface of the support substrate 200. For example, the second opening portion OP2 may extend through the support substrate 200. In an embodiment, the support substrate 200 may include the second opening portions OP2. In other words, the support substrate 200 that is a single support substrate may include the second opening portions OP2. The second opening portions OP2 may be disposed apart from or spaced from each other.

In an embodiment, the second opening portion OP2 may be connected to the first opening portion OP1. The second opening portion OP2 that is a single opening portion may be disposed overlapping the first opening portions OP1. Accordingly, the second opening portion OP2 that is a single opening portion may be connected to the first opening portions OP1.

The mask sheet 300 may include the mask opening portion 300OP. The mask opening portion 300OP may penetrate the upper surface US of the mask sheet 300 and the lower surface LS of the mask sheet 300. For example, the mask opening portion 300OP may extend through the mask sheet 300.

In an embodiment, the mask opening portion 300OP may be connected to the second opening portions OP2. In other words, the mask opening portion 300OP that is a singular mask opening portion may be connected to the second opening portions OP2.

FIGS. 9A-9J are cross-sectional views of a method of manufacturing a mask assembly according to an embodiment.

Figure 9A:
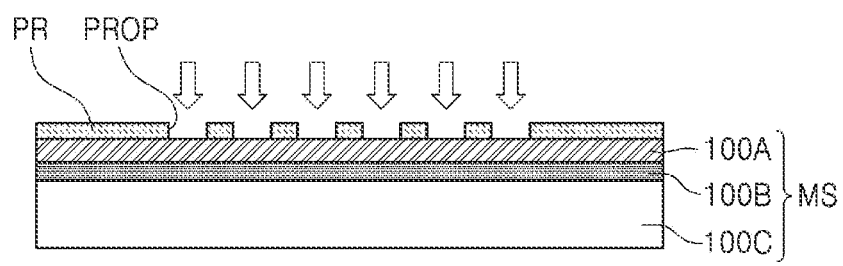
FIGS. 9A-9J are cross-sectional views of a method of manufacturing a mask assembly according to an embodiment.

Referring to FIG. 9A, a mask substrate MS may be prepared. The mask substrate MS may be a silicon-on-insulator (SOI) wafer. In an embodiment, the mask substrate MS may include a first layer 100A, a second layer 100B, and a third layer 100C. The first layer 100A may be a portion that will be a silicon substrate of a mask assembly. The first layer 100A, the second layer 100B, and the third layer 100C may be stacked (e.g., sequentially stacked). The first layer 100A and the third layer 100C may include silicon. In an embodiment, the first layer 100A and the third layer 100C may include silicon crystal. For example, the first layer 100A and the third layer 100C may include a plurality of silicon atoms. The second layer 100B may include a silicon oxide (e.g., $SiO_2$).

A first opening portion may be formed in the first layer 100A. In one or more embodiments, a photoresist layer PR may be formed on the first layer 100A. The photoresist layer PR may be selected to be any one of a positive type or a negative type and formed on the first layer 100A. In a positive type photoresist layer, a light-exposed area is etched later in a development process, and in a negative type photoresist layer, an area other than the exposed area is etched. In the following description, a case in which the photoresist layer PR is of a positive type is described in more detail.

The photoresist layer PR may be formed by applying a photoresist solution to the first layer 100A using various suitable methods such as spin-coating, spraying, dipping, and/or the like.

Furthermore, a process of polishing an upper surface of the first layer 100A on which the photoresist layer PR is to be coated may be additionally performed before with the photoresist layer PR is coated on the upper surface of the first layer 100A.

Next, the photoresist layer PR may be exposed. At least part of the photoresist layer PR may be exposed. For example, when a photomask is in use, an area of the photoresist layer PR that overlaps an opening portion of the photomask may be exposed.

Next, part of the photoresist layer PR may be removed through the development process. Accordingly, a photoresist layer opening portion PROP may be formed on the photoresist layer PR. The photoresist layer opening portion PROP may overlap an area of the first layer 100A where the first opening portion is formed.

Next, the first layer 100A may be etched by using the photoresist layer PR as a mask. Etching may be dry etching. Dry etching may be performed in the photoresist layer opening portion PROP in a direction toward the first layer 100A. In other words, portions of the first layer 100A at or exposed by the photoresist layer opening portion PROP may be etched during a dry etching process.

Figure 9B:
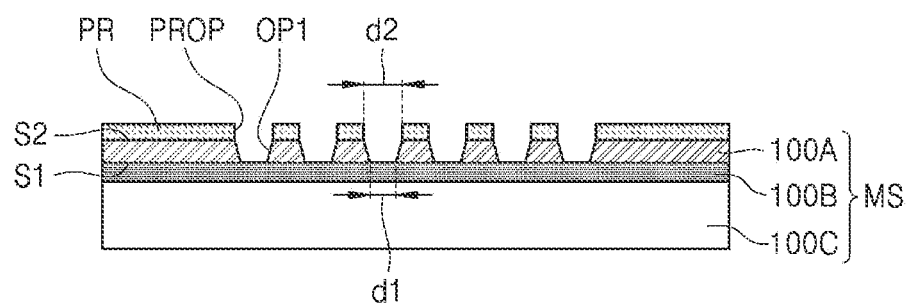

Referring to FIG. 9B, the first layer 100A may include the first surface S1 and the second surface S2 opposite to the first surface S1. The first surface S1 may be a surface facing the second layer 100B. In this case, as dry etching is performed in the photoresist layer opening portion PROP in a direction toward the first layer 100A, the first width d1 of the first opening portion OP1 in the first surface S1 of the first layer 100A may be formed to be less than the second width d2 of the first opening portion OP1 in the second surface S2. Accordingly, the first width d1 of the first opening portion OP1 in or at the first surface S1 of the first layer 100A may be less than the second width d2 of the first opening portion OP1 in or at the second surface S2.

In an embodiment, the width of the first opening portion OP1 may be formed to constantly decrease. For example, the width of the first opening portion OP1 may be formed to constantly decrease in or at the second surface S2 in a direction toward the first surface S1. In another embodiment, an inner side surface of the first opening portion OP1 may include a curved surface. In the following description, a case in which the width of the first opening portion OP1 constantly decreases is described in more detail.

Figure 9C:
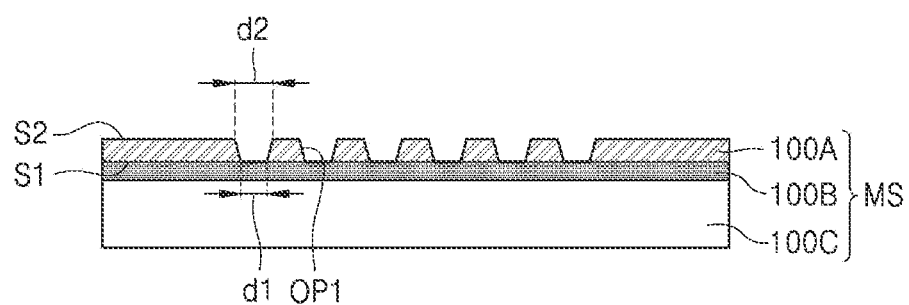

Referring to FIG. 9C, the photoresist layer PR may be removed. Accordingly, the second surface S2 of the first layer 100A may be exposed to the outside.

Figure 9D:
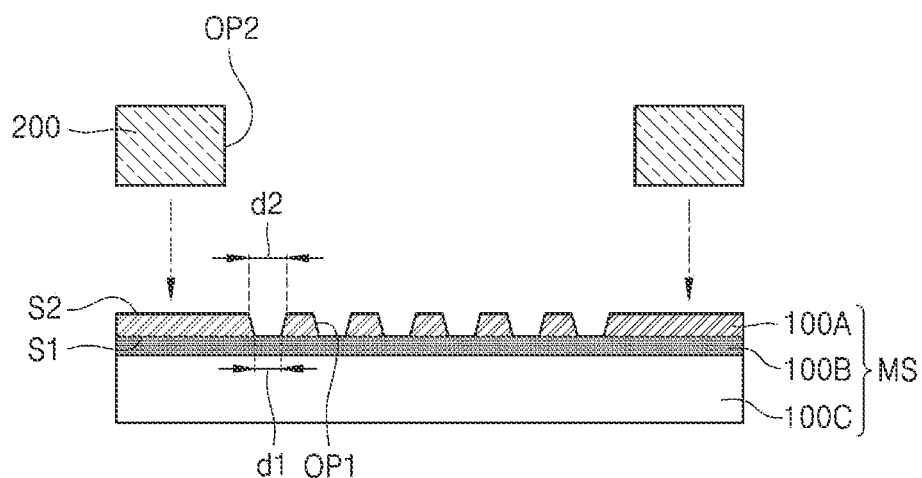
Figure 9E:
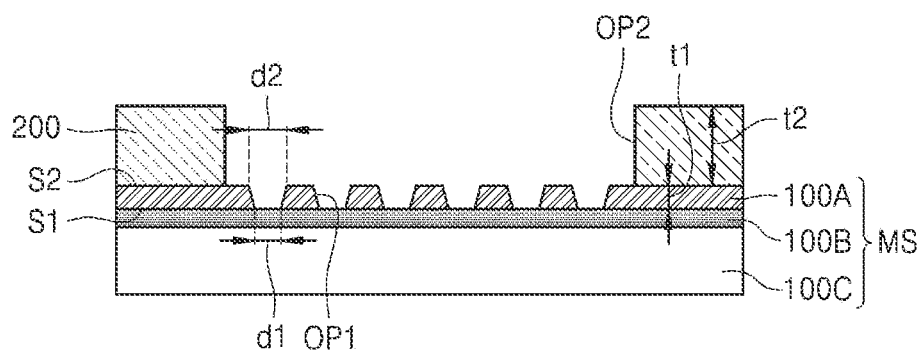

Referring to FIGS. 9D and 9E, the support substrate 200 including the second opening portion OP2 may be prepared. The second thickness t2 of the support substrate 200 may be thicker than the first thickness t1 of the first layer 100A. The second opening portion OP2 may penetrate the upper surface of the support substrate 200 and the lower surface of the support substrate 200. For example, the second opening portion OP2 may extend through the support substrate 200.

The support substrate 200 may be disposed on the first layer 100A. For example, the support substrate 200 may be disposed on the second surface S2 of the first layer 100A. The first opening portions OP1 may be connected to the second opening portion OP2.

In an embodiment, the support substrate 200 may include the same material as the first layer 100A. For example, the support substrate 200 may include silicon. In another embodiment, the support substrate 200 may include glass.

The support substrate 200 may be directly connected to the first layer 100A. For example, the support substrate 200 may be directly connected to the second surface S2 of the first layer 100A.

In an embodiment, when the support substrate 200 includes silicon crystal like the first layer 100A, the support substrate 200 may be directly bonded or fusion bonded to the first layer 100A.

First, impurities on the surface of each of the support substrate 200 and the first layer 100A may be removed. In an embodiment, the support substrate 200 and the first layer 100A may be dry cleaned. For example, a plasma processing process, a UV/ozone cleaning process, and/or a wet chemical cleaning process may be performed on the support substrate 200 and the first layer 100A.

Next, the support substrate 200 and the first layer 100A may be aligned to each other, and the support substrate 200 and the first layer 100A may be adhered to each other. For example, the lower surface of the support substrate 200 and the second surface S2 of the first layer 100A facing each other may be adhered to each other. A considerable portion of a silanol (Si—OH) group may be polymerized, at room temperature, forming $Si_2O$ and water molecules ($H_2O$). In an embodiment, when the support substrate 200 and the first layer 100A are directly connected to each other, $Si_2O$ may be formed on the second surface S2.

Next, an annealing process may be performed to increase a bonding strength of the support substrate 200 and the first layer 100A. The annealing process may provide a certain amount of heat energy so that more silanol (Si—OH) groups react to each other, and a new chemical bond may be formed. As a result, the bonding strength of the support substrate 200 and the first layer 100A may be increased. The $H_2O$ may diffuse along the second surface S2.

In another embodiment, when the support substrate 200 includes glass, the support substrate 200 and the first layer 100A may be anodic-bonded to each other.

First, the support substrate 200 may be disposed on the first layer 100A. The support substrate 200 may be directly disposed on the first layer 100A.

Next, an electrostatic field may be applied to the first layer 100A and the support substrate 200. For example, an electrode may be connected to each of the first layer 100A and the support substrate 200. An electrostatic field may be applied to the first layer 100A and the support substrate 200 at a temperature of about 200° C. to about 500° C. (e.g., 200° C. to 500° C.). In this case, in an embodiment, $Si_2O$ may be formed on the second surface S2.

Next, the first layer 100A and the support substrate 200 may be cooled. Accordingly, the first layer 100A and the support substrate 200 may be directly connected to each other through an anodic bonding process.

Figure 9F:
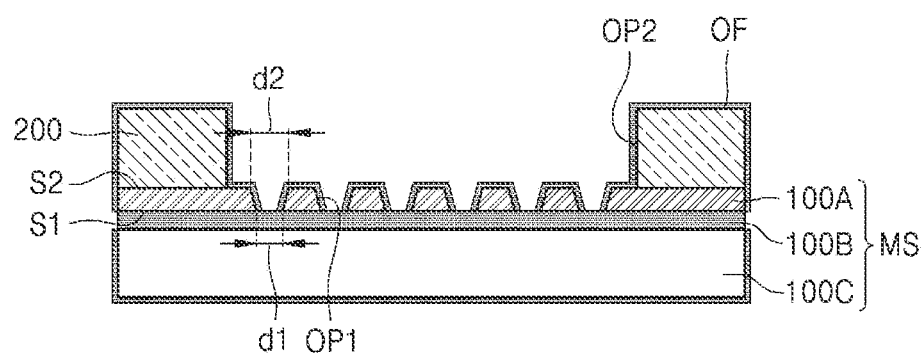

Referring to FIG. 9F, in an embodiment, a silicon oxide film OF may be formed on the mask substrate MS and the support substrate 200. For example, the silicon oxide film OF may be formed on the surfaces of the first layer 100A, the third layer 100C, and the support substrate 200. In an embodiment, the silicon oxide film OF may be formed in a thermal oxidation process.

The silicon oxide film OF may prevent or substantially prevent the mask substrate MS or the support substrate 200 from being etched in a wet etching process. The silicon oxide film OF may include $SiO_2$. The silicon oxide film OF may include the same material as the second layer 100B.

In an embodiment, when only a dry etching process is performed in a process of forming a mask assembly, a process of forming the silicon oxide film OF may be omitted. In the following description, a case in which the silicon oxide film OF is formed on the surfaces of the mask substrate MS and the support substrate 200 is described in more detail.

Figure 9G:
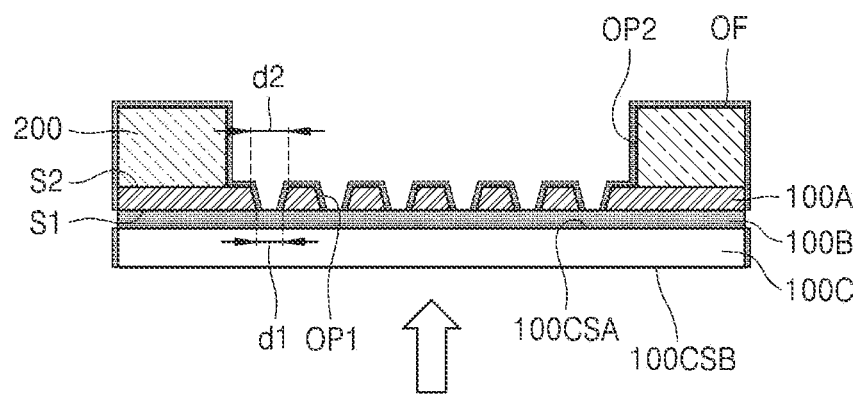
Figure 9H:
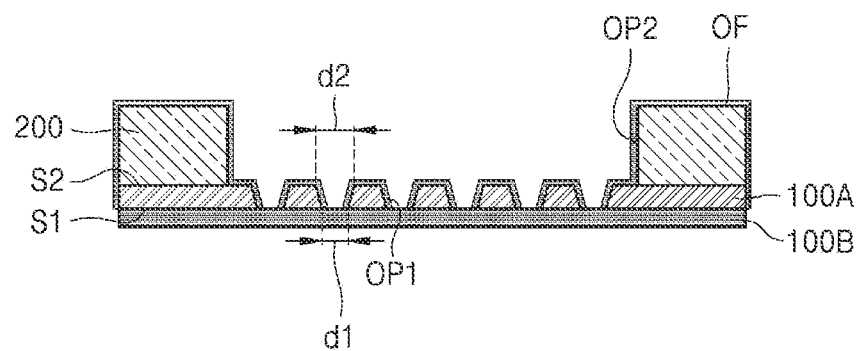

Referring to FIGS. 9F, 9G, and 9H, the third layer 100C may be removed. In an embodiment, the third layer 100C may be polished. The thickness of the third layer 100C may be decreased. Furthermore, part of the silicon oxide film OF formed on the third layer 100C may be removed. In an embodiment, a polishing process may be a chemical mechanical polishing (CMP) process.

At least part of the third layer 100C may be exposed. For example, as part of the silicon oxide film OF formed on the third layer 100C is removed, at least part of the third layer 100C may be exposed. For example, the third layer 100C may include an upper surface 100CSA of the third layer 100C facing the first surface S1 of the first layer 100A. Furthermore, the third layer 100C may include a lower surface 100CSB of the third layer 100C opposite to the upper surface 100CSA of the third layer 100C. The lower surface 100CSB of the third layer 100C may be exposed to the outside.

In an embodiment, the third layer 100C may be removed by a wet etching process. The lower surface 100CSB of the third layer 100C may not be covered with the silicon oxide film OF and may be exposed to the outside. Accordingly, the third layer 100C may be removed by a wet etching process. As the first layer 100A and the support substrate 200 are covered with the silicon oxide film OF, the first layer 100A and the support substrate 200 may be prevented or substantially prevented from being wet etched. In another embodiment, the third layer 100C may be removed by a dry etching process.

Figure 9I:
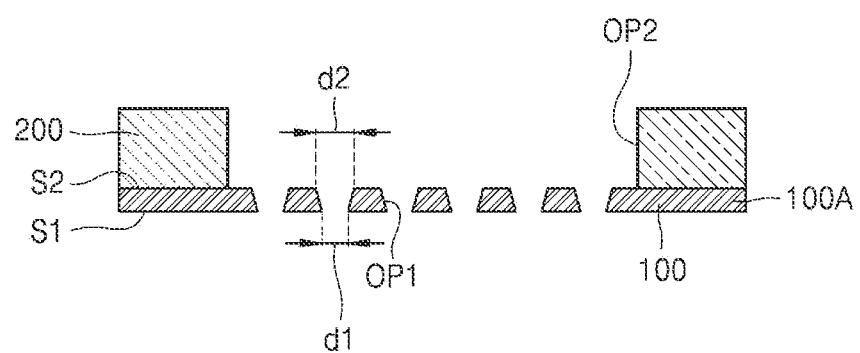

Referring to FIGS. 9H and 9I, the second layer 100B may be removed. In an embodiment, when the second layer 100B is removed, the silicon oxide film OF may also be removed. As the second layer 100B and the silicon oxide film OF both include $SiO_2$, the second layer 100B and the silicon oxide film OF may be concurrently (e.g., simultaneously) removed in the same process. Accordingly, the time to manufacture a mask assembly may be reduced. In another embodiment, after the second layer 100B is removed, the silicon oxide film OF may be removed. In another embodiment, after the silicon oxide film OF is removed, the second layer 100B may be removed.

The silicon substrate 100 and the support substrate 200 of the mask assembly may be manufactured through the above-described process. The first layer 100A of the mask substrate may be the silicon substrate 100 of the mask assembly.

Figure 9J:
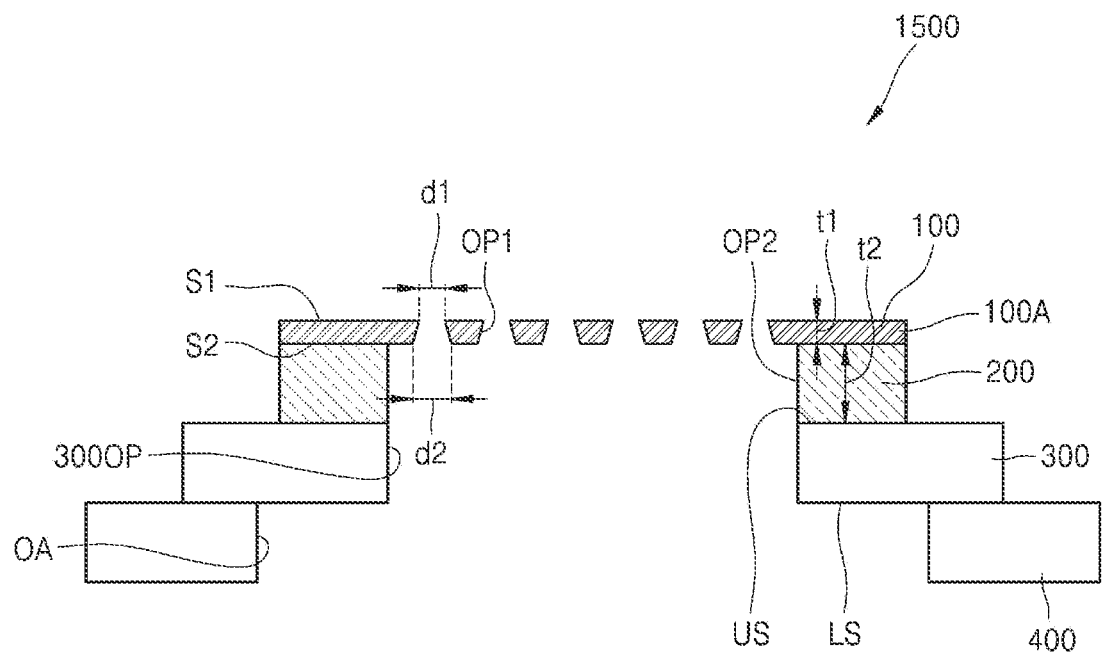

Referring to FIG. 9J, the mask sheet 300 provided with the mask opening portion 300OP may be disposed on the support substrate 200. The support substrate 200 may be disposed between the silicon substrate 100 and the mask sheet 300.

The mask sheet 300 may include the upper surface US and the lower surface LS opposite to the upper surface US. The upper surface US of the mask sheet 300 may be disposed to face the second surface S2 of the first layer 100A. Furthermore, the upper surface US of the mask sheet 300 may be disposed to face the support substrate 200.

In one or more embodiments, the support substrate 200 and the mask sheet 300 may be adhered to each other by an adhesive member.

The mask frame 400 may be disposed below the mask sheet 300. In other words, the mask sheet 300 may be disposed on the mask frame 400. The mask sheet 300 may be disposed between the support substrate 200 and the mask frame 400. The mask sheet 300 may be fixed to the mask frame 400 by welding, and the mask sheet 300 may be in a tensile state.

The second thickness t2 of the support substrate 200 may be greater than the first thickness t1 of the silicon substrate 100. During the manufacture of the mask assembly 1500, when a robot arm and/or the like directly contacts and transfers the silicon substrate 100, the silicon substrate 100 may be damaged. During the manufacture of the mask assembly 1500, when a robot arm and/or the like directly contacts and transfers the support substrate 200 that is thicker than the silicon substrate 100, damage to the silicon substrate 100 may be prevented. Accordingly, because damage to the silicon substrate 100 is prevented using the support substrate 200, the mask assembly 1500 may be manufactured.

Figure 10:
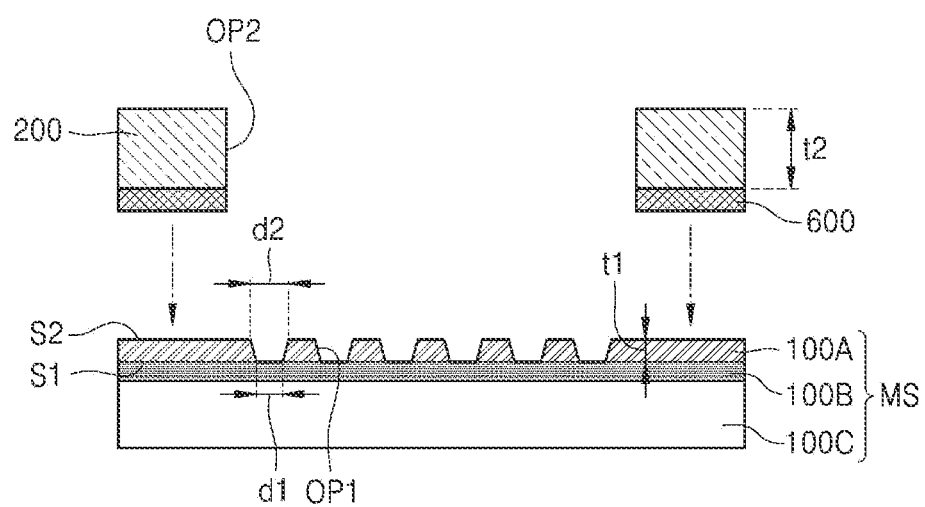
FIG. 10 is a cross-sectional view of a method of manufacturing a mask assembly according to another embodiment.

FIG. 10 is a cross-sectional view of a method of manufacturing a mask assembly according to another embodiment. In FIG. 10, as the same reference numerals as those of FIG. 9D denote the same elements, and therefore, redundant descriptions thereof may not be repeated.

Referring to FIG. 10, the support substrate 200 including the second opening portion OP2 may be disposed on the first layer 100A. The support substrate 200 may be adhered to the first layer 100A by using the intermediate adhesive member 600.

In an embodiment, first, intermediate adhesive member 600 may be first adhered to the support substrate 200. Next, the intermediate adhesive member 600 may be adhered to the first layer 100A. Accordingly, the first layer 100A and the support substrate 200 may be connected to each other via the intermediate adhesive member 600. In another embodiment, the intermediate adhesive member 600 may be first adhered to the first layer 100A. Next, the intermediate adhesive member 600 may be adhered to the support substrate 200. Accordingly, the first layer 100A and the support substrate 200 may be connected to each other through the intermediate adhesive member 600. In another embodiment, after the intermediate adhesive member 600 is adhered to each of the first layer 100A and the support substrate 200, the first layer 100A and the support substrate 200 may be connected to each other through the intermediate adhesive member 600.

Referring back to FIG. 1, the apparatus 1000 for manufacturing a display device may be used to manufacture a display device that is described in more detail below. In one or more embodiments, when the pressure control unit 1800 makes the inside of the chamber 1100 (e.g., the pressure inside the chamber) reach a state that is the same as or similar to the atmospheric pressure, the gate valve operates so that an open portion of the chamber 1100 is opened.

Then, the display substrate D may be loaded into the chamber 1100 through the open portion of the chamber 1100 from the outside. The display substrate D may be a display device being manufactured. The display substrate D may be loaded into the chamber 1100 using various suitable methods. In an embodiment, the display substrate D may be loaded into the chamber 1100 from the outside by a robot arm and/or the like disposed outside the chamber 1100. In another embodiment, when the substrate support 1200 is provided in the form of a shuttle, the substrate support 1200 may be carried out from the inside of the chamber 1100 to the outside of the chamber 1100. Next, by a separate robot arm and/or the like disposed outside the chamber 1100, the display substrate D may be placed on the substrate support 1200 and the substrate support 1200 may be loaded from the outside of the chamber 1100 to the inside of the chamber 1100.

In an embodiment, the mask assembly 1500 may be disposed in the chamber 1100. In another embodiment, similar to the display substrate D, the mask assembly 1500 may be loaded into the chamber 1100 from the outside of the chamber 1100. In this case, the mask assembly 1500 may be disposed in the chamber 1100 to face the source unit 1400 for supplying a deposition material.

When the display substrate D is loaded into the chamber 1100, the display substrate D may be placed on the substrate support 1200. In this case, the display substrate D may be disposed at a side opposite to the source unit 1400 with respect to the mask assembly 1500. In other words, the mask assembly 1500 may be between the display substrate D and the source unit 1400 when the display substrate D is placed on the substrate support 1200. The vision unit 1700 may photograph the positions of the display substrate D and the mask assembly 1500. The mask support 1300 may adjust (e.g., finely adjust) the position of the mask assembly 1500 on the basis of (based on) the positions of the display substrate D and the mask assembly 1500 identified by the vision unit 1700.

Next, the mask assembly 1500 may approach the display substrate D by using the electromagnetic unit 1600.

Next, as the source unit 1400 operates, the deposition material may be supplied to the side of the mask assembly 1500. The deposition material may pass through the mask assembly 1500 to be deposited on the display substrate D. For example, the deposition material may pass through the opening area OA of the mask frame 400, the mask opening portion 300OP of the mask sheet 300, the second opening portion OP2 of the support substrate 200, and the first opening portion OP1 of the silicon substrate 100, and may be deposited on the display substrate D. The pump 1820 may suck the gas in the chamber 1100 and discharge the gas to the outside so that the pressure in the chamber 1100 may be maintained in a state that is the same as or similar to a vacuum.

The above-described mask assembly 1500 may include the silicon substrate 100 and the support substrate 200. The first opening portion OP1 of the silicon substrate 100 may have a tapered shape. Accordingly, the apparatus 1000 for manufacturing a display device may precisely control the deposition position of the deposition material on the display substrate D, and thus a display device having a high resolution may be manufactured.

A display device that is manufactured by using the above-described apparatus 1000 is described below in more detail.

A display device is a device for displaying an image, which may be a mobile device, for example, a game device, a multimedia device, an ultra-compact PC. The display device may include a liquid crystal display device, an electrophoretic display device, an organic light-emitting display device, an inorganic EL display device, a field emission display device, a surface-conduction electron-emitter display device, a quantum-dot display device, a plasma display device, a cathode ray display device, and/or the like. In the following description, although an organic light-emitting display device is described as an example of the display device according to an embodiment, various suitable types of display devices as described above may be used according to one or more embodiments of the present disclosure.

Figure 11:
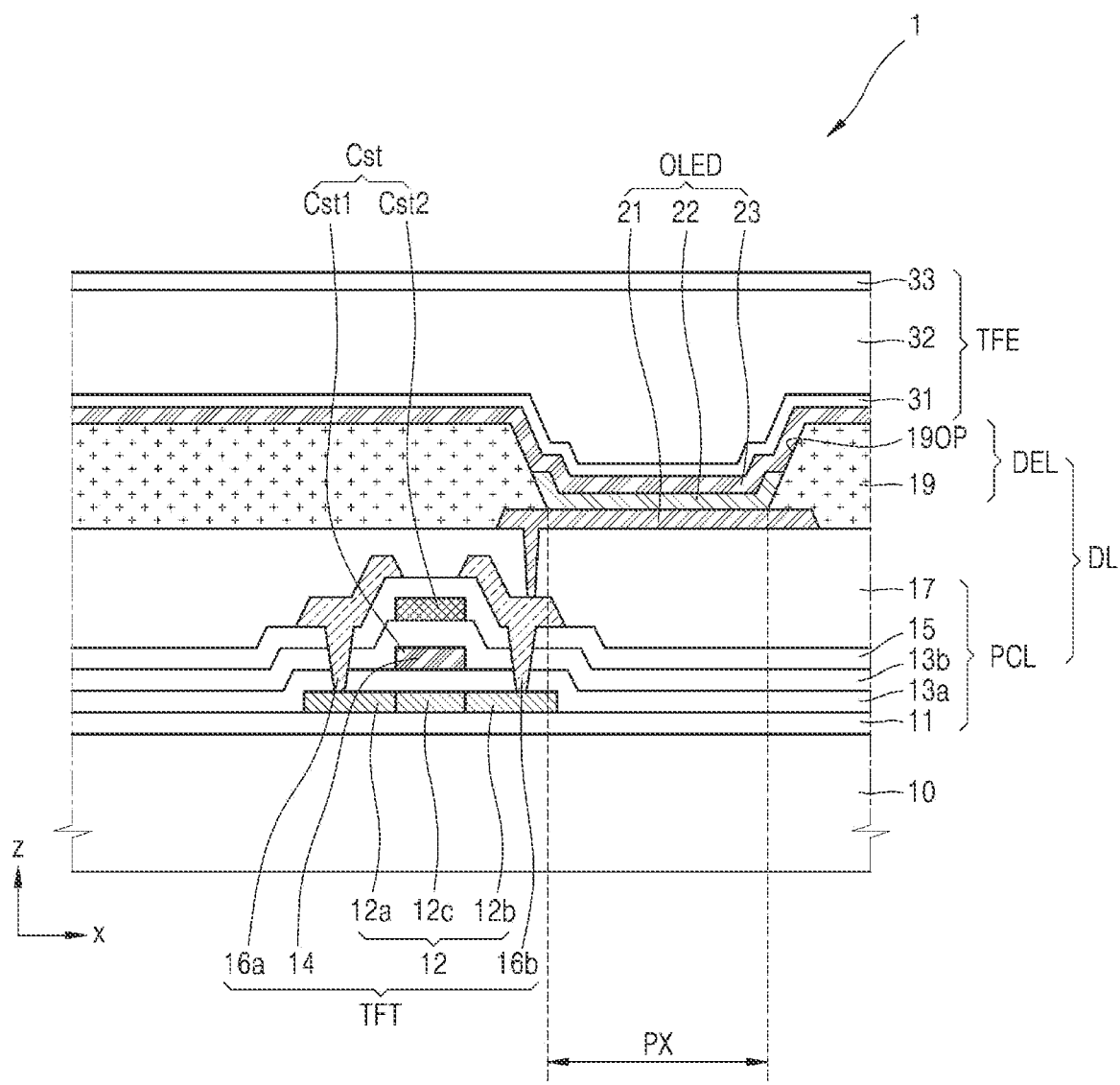
FIG. 11 is a schematic cross-sectional view of a display device manufactured by an apparatus for manufacturing a display device, according to an embodiment.

FIG. 11 is a schematic cross-sectional view of a display device a manufactured by an apparatus for manufacturing a display device, according to an embodiment.

Referring to FIG. 11, the display device 1 may include a substrate 10, a display layer DL, and a thin film encapsulation layer TFE. The display layer DL and the thin film encapsulation layer TFE may be disposed (e.g., sequentially disposed) on the substrate 10. The display layer DL may include a pixel circuit layer PCL and a display element layer DEL.

The substrate 10 may include glass or polymer resin such as polyethersulfone, polyarylate, polyetherimide, polyethylene naphthalate, polyethylene terephthalate, polyphenylene sulfide, polyimide, polycarbonate, cellulose acetate propionate, and/or the like.

A barrier layer may be further provided between the display layer DL and the substrate 10. The barrier layer may prevent or substantially prevent intrusion of external foreign materials and may be a single layer or a multilayer including an inorganic material such as a silicon nitride ($SiN_X$) and/or $SiO_2$.

The pixel circuit layer PCL may be disposed on the substrate 10. The pixel circuit layer PCL may include a thin film transistor TFT and a buffer layer 11, a first gate insulating layer 13*a*, a second gate insulating layer 13*b*, an interlayer insulating layer 15, and a planarizing insulating layer 17 which are disposed above and/or below constituent elements of the thin film transistor TFT.

The buffer layer 11 may be disposed on the substrate 10. The buffer layer 11 may include an inorganic insulating material such as $SiN_X$, silicon oxynitride SiON, and/or $SiO_2$, and may be a single layer or a multilayer including the above-described inorganic insulating material.

The thin film transistor TFT may include a semiconductor layer 12, a gate electrode 14, a source electrode 16*a*, and a drain electrode 16*b*. The semiconductor layer 12 may include polysilicon. Alternatively, the semiconductor layer 12 may include amorphous silicon, oxide semiconductor, organic semiconductor, and/or the like. The semiconductor layer 12 may include a channel region 12*c* and a source region 12*a* and a drain region 12*b* disposed at respective sides of the channel region 12*c*.

The gate electrode 14 may overlap the channel region 12*c*. The gate electrode 14 may include a metal material (e.g., a low-resistance metal material). The gate electrode 14 may include a conductive material including molybdenum (Mo), aluminum (Al), copper (Cu), titanium (Ti), and/or the like, and may be a multilayer or a single layer including the above material.

The first gate insulating layer 13*a* between the semiconductor layer 12 and the gate electrode 14 may include an inorganic insulating material such as $SiO_2$, $SiN_X$, silicon oxynitride (SiON), aluminum oxide ($Al_2O_3$), titanium oxide ($TiO_2$), tantalum oxide ($Ta_2O_5$), hafnium oxide ($HfO_2$), zinc oxide (ZnO) and/or the like.

The second gate insulating layer 13*b* may cover the gate electrode 14. The second gate insulating layer 13*b*, like the first gate insulating layer 13*a*, may include and inorganic insulating material such as $SiO_2$, $SiN_X$, SiON, $Al_2O_3$, $TiO_2$, $Ta_2O_5$, $HfO_2$, ZnO, and/or the like.

An upper electrode Cst2 of a storage capacitor Cst may be disposed above the second gate insulating layer 13*b*. The upper electrode Cst2 may overlap the gate electrode 14 thereunder. The gate electrode 14 and the upper electrode Cst2 overlapping each other with the second gate insulating layer 13*b* therebetween may form the storage capacitor Cst. In other words, the gate electrode 14 may function as a lower electrode Cst1 of the storage capacitor Cst.

As such, the storage capacitor Cst and the thin film transistor TFT may overlap with each other. In some embodiments, the storage capacitor Cst may not overlap the thin film transistor TFT.

The upper electrode Cst2 may include Al, platinum (Pt), palladium (Pd), silver (Ag), magnesium (Mg), gold (Au), nickel (Ni), neodymium (Nd), iridium (Ir), chromium (Cr), calcium (Ca), Mo, Ti, tungsten (W), and/or Cu, and may be a single layer or multilayer of the above-described material.

The interlayer insulating layer 15 may cover the upper electrode Cst2. The interlayer insulating layer 15 may include $SiO_2$, $SiN_X$, SiON, $Al_2O_3$, $TiO_2$, $Ta_2O_5$, $HfO_2$, ZnO, and/or the like. The interlayer insulating layer 15 may be a single layer or multilayer including the above-described inorganic insulating material.

The source electrode 16a and the drain electrode 16b each may be located on the interlayer insulating layer 15. The source electrode 16a and the drain electrode 16b may include a material having a high conductivity. The source electrode 16a and the drain electrode 16b may include a conductive material including Mo, Al, Cu, Ti, and/or the like, and may be a multilayer or single layer including the above material. In an embodiment, the source electrode 16a and the drain electrode 16b may have a multilayer structure of Ti/Al/Ti.

The planarizing insulating layer 17 may include an organic insulating layer. The planarizing insulating layer 17 may include an organic insulating material, for example, one or more selected from general purpose polymers (such as polymethylmethacrylate (PMMA) and/or polystyrene (PS)), polymer derivatives having phenolic groups, acryl polymers, imide polymers, aryl ether polymers, amide polymers, fluorine polymers, p-xylene polymers, vinyl alcohol polymers, and blends thereof.

The display element layer DEL may be disposed on the pixel circuit layer PCL. The display element layer DEL may include an organic light-emitting diode (OLED), and a pixel electrode 21 of the OLED may be electrically connected to the thin film transistor TFT via a contact hole of the planarizing insulating layer 17.

The OLED may emit, for example, red, green, or blue light, or, in another example, red, green, blue, or white light.

The pixel electrode 21 may include a conductive oxide such as indium tin oxide (ITO), indium zinc oxide (IZO), zinc oxide (ZnO), indium oxide ($In_2O_3$), indium gallium oxide (IGO), aluminum zinc oxide (AZO), and/or the like. In another embodiment, the pixel electrode 21 may include a reflection film including Ag, Mg, Al, Pt, Pd, Au, Ni, Nd, Ir, Cr, or a compound thereof. In another embodiment, the pixel electrode 21 may further include a film formed of ITO, IZO, ZnO, or $In_2O_3$ above/below the above-described reflection film.

A pixel definition layer 19 having an opening 19OP that exposes a central portion of the pixel electrode 21 may be disposed on the pixel electrode 21. The pixel definition layer 19 may include an organic insulating material and/or an inorganic insulating material. The opening 19OP may define an emission area of light emitted from the OLED. For example, the width of the opening 19OP may be a width of the emission area. The width of the emission area may be defined to be the width of a sub-pixel PX provided in the display device 1.

An emission layer 22 may be disposed in the opening 19OP of the pixel definition layer 19. The emission layer 22 may include a polymer or low molecular organic material that emits light of a certain color. The emission layer 22 may be formed by using the apparatus 1000 for manufacturing a display device. In other words, the apparatus 1000 for manufacturing a display device may deposit the deposition material to form the emission layer 22 in the opening 19OP of the pixel definition layer 19.

In one or more embodiments, a first function layer and a second function layer may be disposed above and under the emission layer 22. The first function layer may include, for example, a hole transport layer (HTL), a hole transport layer, and a hole injection layer (HIL). The second function layer may be an optional constituent element disposed on the emission layer 22. The second function layer may include an electron transport layer (ETL) and/or an electron injection layer (EIL). The first function layer and/or the second function layer may be a common layer that is formed to entirely cover the substrate 10 like a common electrode 23 that is described in more detail below.

The common electrode 23 may include a conductive material having a low work function. For example, the common electrode 23 may include a (semi-) transparent layer including Ag, Mg, Al, Pt, Pd, Au, Ni, Nd, Ir, Cr, lithium (Li), Ca, an alloy thereof, and/or the like. Alternatively, the common electrode 23 may further include a layer such as ITO, IZO, ZnO, or $In_2O_3$ on the (semi-) transparent layer including the above-described material.

In an embodiment, the thin film encapsulation layer TFE may include at least one inorganic encapsulation layer and at least one organic encapsulation layer. In an embodiment, FIG. 11 illustrates the thin film encapsulation layer TFE includes a first inorganic encapsulation layer 31, an organic encapsulation layer 32, and a second inorganic encapsulation layer 33, which are sequentially stacked.

The first inorganic encapsulation layer 31 and the second inorganic encapsulation layer 33 may include one or more inorganic materials of $Al_2O_3$, $TiO_2$, $Ta_2O_5$, $HfO_2$, ZnO, $SiO_2$, $SiN_X$, and SiON. The organic encapsulation layer 32 may include a polymer-based material. The polymer-based material may include acryl resin, epoxy resin, polyimide, polyethylene, and/or the like. In an embodiment, the organic encapsulation layer 32 may include acrylate.

In another embodiment, the thin film encapsulation layer TFE may have a structure in which the substrate 10 and an upper substrate that is a transparent member are coupled by a sealing member and an inner space between the substrate 10 and the upper substrate is sealed. A desiccant, a filler, and/or the like may be located in the inner space. The sealing member may be a sealant, and in another embodiment, the sealing member may include a material that is cured by laser. For example, the sealing member may be a frit. In one or more embodiments, the sealing member may include an organic sealant such as urethane-based resin, epoxy-based resin, and acryl-based resin, or an inorganic sealant such as silicone and/or the like. For example, urethane acrylate and/or the like may be used as urethane-based resin. For example, butyl acrylate, ethylhexyl acrylate, and/or the like may be used as acryl-based resin. The sealing member may include a material that is cured by heat.

A touch electrode layer including touch electrodes is disposed on the thin film encapsulation layer TFE, and an optical function layer may be disposed on the touch electrode layer. The touch electrode layer may obtain coordinate information according to an external input, for example, a touch event. The optical function layer may reduce reflectivity of external light input to the display device 1 and/or improve color purity of the light emitted from the display device 1. In an embodiment, the optical function layer may include a retarder and a polarizer. The retarder may be of a film type or a liquid crystal coating type, and may include a λ/2 retarder and/or a λ/4 retarder. The polarizer may also be of a film type or a liquid crystal coating type. The film type (or film) may include a stretchable synthetic resin film, and the liquid crystal coating type (or coating) may include liquid crystals arranged in a set or certain arrangement. The retarder and the polarizer may further include a protection film.

In another embodiment, the optical function layer may include a black matrix and color filters. The color filters may be arranged considering the color of light emitted from each of the sub-pixels PX of the display device 1. In one or more embodiments, the color filters may be arranged to overlap the sub-pixels PX of the display device 1. Each of the color filters may include red, green, or blue pigment or dye. Alternatively, the color filters each may further include quantum dots in addition to the above-described pigment or dye. Alternatively, some of the color filters may not include the above-described pigment or dye, and may include scattering particles such as titanium oxide.

In another embodiment, the optical function layer may include a destructive interference structure. The destructive interference structure may include a first reflection layer and a second reflection layer disposed on different layers. First reflected light and second reflected light respectively reflected from the first reflection layer and the second reflection layer may destructively interfere with each other, and accordingly the reflectivity of the external light may be reduced.

An adhesive member may be disposed between the touch electrode layer and the optical function layer. Generally, any suitable adhesive member may be disposed between the touch electrode layer and the optical function layer. For example, the adhesive member may be a pressure sensitive adhesive (PSA).

As described above, according to one or more embodiments of the present disclosure, as the mask assembly includes the silicon substrate and the support substrate, an apparatus for manufacturing a display device with enhanced reliability and improved deposition efficiency may be provided.

Furthermore, according to one or more embodiments of the present disclosure, as the support substrate is disposed on the first layer, an apparatus for manufacturing a display device with enhanced reliability and improved deposition efficiency may be provided.

Furthermore, according to one or more embodiments of the present disclosure, as the mask assembly includes the silicon substrate and the support substrate, an apparatus for manufacturing a display device with improved deposition efficiency may be provided.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and equivalents thereof.

What is claimed is:

1. An apparatus for manufacturing a display device, the apparatus comprising:
   a mask assembly, the mask assembly comprising:
   a plurality of silicon substrates, each silicon substrate of the plurality of silicon substrates comprising a first surface, a second surface opposite to the first surface, and a first opening portion penetrating the first surface and the second surface;
   a support substrate on the second surface, the support substrate comprising a second opening portion connected to the first opening portion, and
   a mask sheet comprising a plurality of mask opening portions, each silicon substrate being aligned with a corresponding one of the plurality of mask opening portions, and the support substrate being between the mask sheet and the plurality of silicon substrates,
   wherein the first opening portion at the first surface is less in width than the first opening portion at the second surface.

2. The apparatus of claim 1, wherein the support substrate is greater in thickness than the silicon substrate.

3. The apparatus of claim 1, wherein the support substrate is directly connected to the second surface of the silicon substrate.

4. The apparatus of claim 3, wherein each of the silicon substrate and the support substrate comprises a plurality of silicon atoms arranged in a first arrangement direction and a second arrangement direction, the second arrangement direction crossing the first arrangement direction,
   wherein a first outer silicon atom at an outermost side from among the plurality of silicon atoms of the silicon substrate and a second outer silicon atom at an outermost side from among the plurality of silicon atoms of the support substrate are adjacent to each other with the second surface therebetween, and
   wherein a third arrangement direction from the center of the first outer silicon atom to the center of the second outer silicon atom crosses the first arrangement direction and the second arrangement direction.

5. The apparatus of claim 3, wherein the support substrate comprises a plurality of first silicon atoms arranged in a first arrangement direction and a second arrangement direction, the second arrangement direction crossing the first arrangement direction, and
   wherein the silicon substrate comprises a plurality of second silicon atoms arranged in the first arrangement direction and a third arrangement direction, the third arrangement direction crossing the first arrangement direction and the second arrangement direction.

6. The apparatus of claim 3, wherein the second surface comprises silicon monoxide.

7. The apparatus of claim 1, further comprising an intermediate adhesive member between the support substrate and the silicon substrate.

8. The apparatus of claim 1, wherein the mask assembly further comprises:
   a mask frame having an opening area; and
   the mask sheet on the mask frame, the mask sheet comprising an upper surface, a lower surface opposite to the upper surface, and the plurality of mask opening portions penetrating the upper surface and the lower surface,
   wherein the support substrate is on the mask sheet, and
   wherein the second surface of the silicon substrate faces the upper surface of the mask sheet.

9. The apparatus of claim 8, wherein one of the mask sheet or the support substrate comprises a concave portion facing the other one of the mask sheet or the support substrate,
   the apparatus further comprising an adhesive member in the concave portion.

10. The apparatus of claim 1, further comprising:
    a chamber having the mask assembly therein; and
    a source unit in the chamber, the source unit being configured to supply a deposition material, wherein the second surface of the silicon substrate faces the source unit.

* * * * *